United States Patent
Murakami et al.

(10) Patent No.: US 9,810,463 B2
(45) Date of Patent: Nov. 7, 2017

(54) INTEGRATED AIR CONDITIONING SYSTEM AND CONTROL DEVICE THEREOF

(71) Applicant: FUJI ELECTRIC CO., LTD., Kawasaki-shi, Kanagawa (JP)

(72) Inventors: Kenya Murakami, Hachioji (JP); Masaki Takahashi, Hachioji (JP); Taiji Mori, Yokohama (JP); Shunsuke Ohga, Chiba (JP); Shuhei Shibata, Hino (JP); Yuichiro Minegishi, Hino (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 617 days.

(21) Appl. No.: 14/372,393

(22) PCT Filed: Feb. 21, 2013

(86) PCT No.: PCT/JP2013/054394
§ 371 (c)(1),
(2) Date: Jul. 15, 2014

(87) PCT Pub. No.: WO2013/125650
PCT Pub. Date: Aug. 29, 2013

(65) Prior Publication Data
US 2015/0000317 A1    Jan. 1, 2015

(30) Foreign Application Priority Data
Feb. 22, 2012 (JP) .................. 2012-036854

(51) Int. Cl.
*F25D 21/06* (2006.01)
*G05D 23/32* (2006.01)
(Continued)

(52) U.S. Cl.
CPC ............ *F25B 49/02* (2013.01); *F24F 12/002* (2013.01); *F25B 1/005* (2013.01); *F25D 17/06* (2013.01);
(Continued)

(58) Field of Classification Search
CPC .............. F25B 2400/0401; F25B 25/00; F25B 2600/2513; F25B 2700/2106; H05K 7/20836
(Continued)

(56) References Cited

U.S. PATENT DOCUMENTS 4,682,649 A * 7/1987 Greer ................. B60H 1/00007
                                              123/142.5 R
5,477,706 A * 12/1995 Kirol ..................... C09K 5/047
                                              62/101
(Continued)

FOREIGN PATENT DOCUMENTS

JP    H05-054937 U    7/1993
JP    H10-300128 A    11/1998
(Continued)

OTHER PUBLICATIONS

PCT, "International Search Report for International Application No. PCT/JP2013/054394".

*Primary Examiner* — Henry Crenshaw
(74) *Attorney, Agent, or Firm* — Manabu Kanesaka

(57) ABSTRACT

An integrated air conditioning system includes an indirect outdoor air cooler having a first heat exchanger for passing through indoor air as warm air, a second heat exchanger for passing through outdoor air, and piping and a pump for circulating a fluid through the first heat exchanger and the second heat exchanger; an air conditioner having an evaporator, a compressor, and a condenser, for passing the indoor air to convert to cold air; a fan for passing the outdoor air through the second heat exchanger and the condenser; and a control device. The control device sets any mode from
(Continued)

among a first mode for performing an individual operation of the indirect outdoor air cooler, a second mode for performing an individual operation of the air conditioner, or a third mode for performing a combined operation of the air conditioner and the indirect outdoor air cooler, to a current operation mode.

20 Claims, 17 Drawing Sheets

(51) Int. Cl.
    *F25B 27/00*     (2006.01)
    *F25D 21/14*     (2006.01)
    *G01M 1/38*     (2006.01)
    *F25B 49/02*     (2006.01)
    *F24F 12/00*     (2006.01)
    *H05K 7/20*     (2006.01)
    *F25B 1/00*     (2006.01)
    *F25D 17/06*     (2006.01)
    *F24F 11/00*     (2006.01)

(52) U.S. Cl.
    CPC .. *H05K 7/20836* (2013.01); *F24F 2011/0006* (2013.01); *F25B 2600/00* (2013.01); *Y02B 30/563* (2013.01)

(58) Field of Classification Search
    USPC ................................ 62/156, 186, 238.6, 513
    See application file for complete search history.

(56) References Cited

U.S. PATENT DOCUMENTS

| | | | | |
|---|---|---|---|---|
| 6,226,178 | B1* | 5/2001 | Broder | G06F 1/203 |
| | | | | 165/104.33 |
| 6,330,799 | B1* | 12/2001 | Chatterjea | F16D 31/02 |
| | | | | 60/456 |
| 2002/0026797 | A1* | 3/2002 | Sundhar | B60H 1/00478 |
| | | | | 62/3.2 |
| 2005/0115257 | A1* | 6/2005 | Goth | H01L 23/34 |
| | | | | 62/186 |
| 2008/0314062 | A1* | 12/2008 | Ritchey | B01D 53/265 |
| | | | | 62/291 |
| 2010/0011789 | A1* | 1/2010 | Carlson | B60H 1/004 |
| | | | | 62/158 |
| 2010/0023166 | A1* | 1/2010 | Chessel | F25B 25/00 |
| | | | | 700/275 |

FOREIGN PATENT DOCUMENTS

| | | | |
|---|---|---|---|
| JP | 2000-274786 | * | 10/2000 |
| JP | 3354882 | B2 | 12/2002 |
| JP | 3967033 | B2 | 8/2007 |
| JP | 3995825 | B2 | 10/2007 |
| JP | 4074422 | B2 | 4/2008 |
| JP | 4145632 | B2 | 9/2008 |
| JP | 2011-075194 | A | 4/2011 |

* cited by examiner

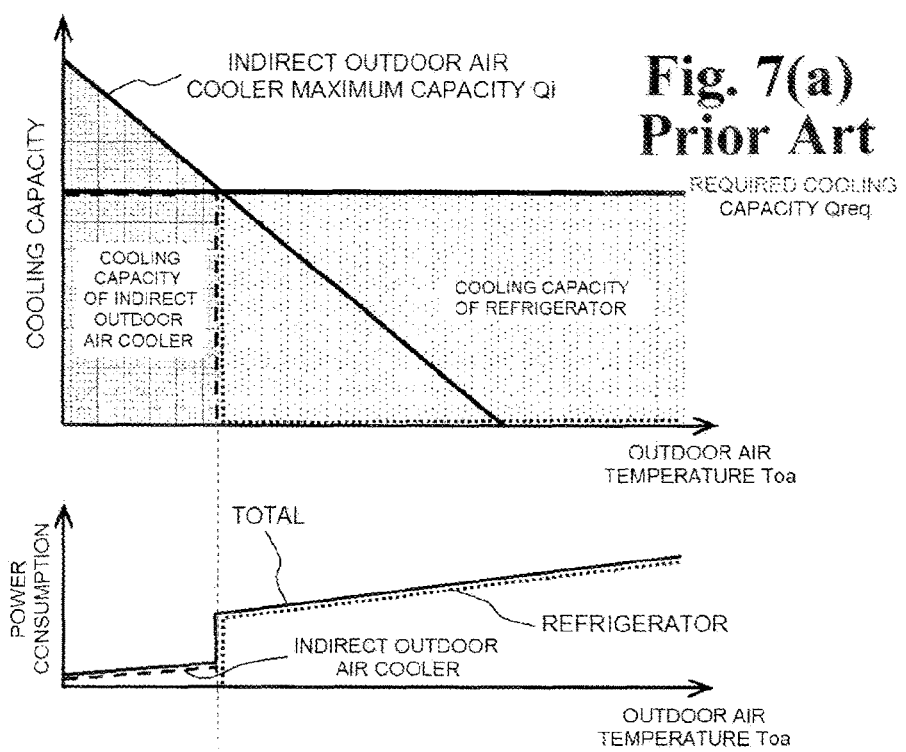
Fig. 7(a)
Prior Art
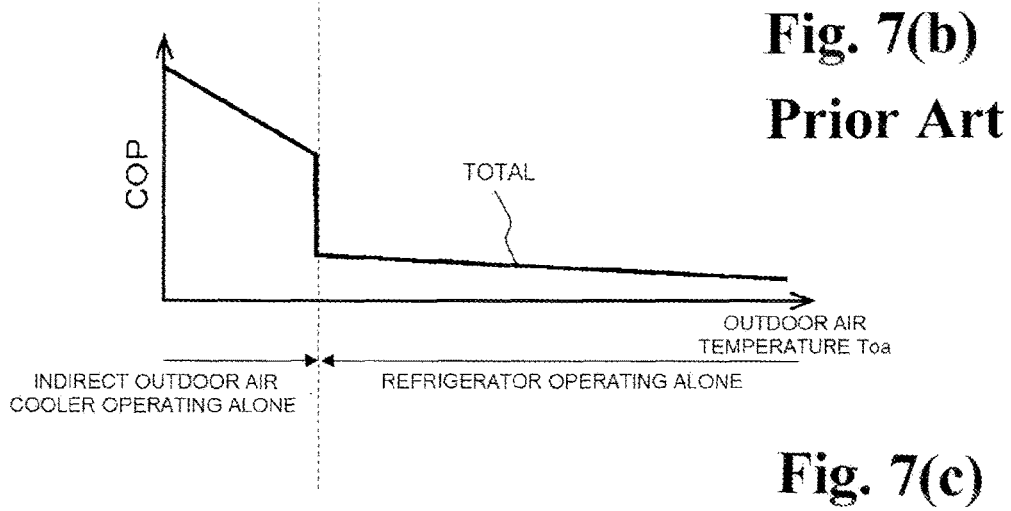
Fig. 7(b)
Prior Art
Fig. 7(c)
Prior Art

Amended

INTEGRATED AIR CONDITIONING SYSTEM AND CONTROL DEVICE THEREOF

RELATED APPLICATIONS

The present application is National Phase of International Application No. PCT/JP2013/054394 filed Feb. 21, 2013, and claims priority from Japanese Application No. 2012-036854 filed Feb. 22, 2012.

TECHNICAL FIELD

The present invention relates to an air conditioning system.

BACKGROUND ART

Conventionally, multiple servers or the like are installed in data centers, corporate server rooms and the like. The temperature in such server rooms or the like rises due to the heat generated by the multiple servers. This increased temperature may give rise to server runaway or malfunction. Accordingly, air conditioning systems are used, in the server rooms, to maintain a constant temperature of the room as a whole. Such air conditioning systems operate substantially full-time, also in winter.

For conventional air conditioning systems for such server rooms or the like, low-temperature air (cold air) blown from an air conditioning device is supplied into the server room while contacting with the servers in server racks to cool the servers and stabilize the room temperature in the server room. As a result, a circulation scheme is resorted to wherein air (warm air) that is warmed by the heat of the servers is returned from the server room to the air conditioning device, and is cooled by the air conditioning device, to be cold air again that is then blown out into the server room, to supply cold air once more.

Known conventional technologies include for instance those described in Patent documents 1, 2, 3, 4, 5.

Patent document 1 is an invention, relating to indirect outdoor air cooling, that involves a configuration wherein a refrigerant pump is operated, instead of a compressor, when, for instance, outdoor air temperature is low; as a result, a cooling operation (cooling of a refrigerant using outdoor air) can be carried out simply by causing a refrigerant to circulate by the refrigerant pump. In the invention of Patent document 1, controlling of increasing and reducing the air volume of an exterior side fan is proportional to the difference between an interior temperature and a set value.

Patent document 2 relates to an air conditioner including the refrigeration cycle, which has, for instance, a compressor and a water-cooled condenser, and a cooling water circulation cycle that has for instance a cooling tower and a cooling water circulating pump to circulate the cooling water in the water-cooled condenser. In the invention of Patent document 2, for instance, the cooling amount of the cooling tower is increased, the water supply amount of the cooling water circulating pump is increased, the rotational speed of the compressor is increased, the air volume of the interior fan is increased, and the degree of opening of an expansion valve is controlled, when the interior temperature is equal to or higher than a predefined value.

The control scheme in Patent document 2 includes first control to fourth control, as control modes. In the first control, the devices in the refrigeration cycle are operated at a low load, and the devices in the cooling water circulation cycle are operated at a high load. In the second control, the devices in the refrigeration cycle are operated at a high load, and the devices in the cooling water circulation cycle are operated at a low load. In the third control, the devices in the refrigeration cycle are operated at a high load, and some of the devices in the cooling water circulation cycle are operated at a low load and the rest at a high load. In the fourth control, the devices in the refrigeration cycle are operated at a low load, and some of the devices in the cooling water circulation cycle are operated at a low load and the rest at a high load.

Patent document 3 is an invention, relating to indirect outdoor air cooling, which involves a configuration wherein a refrigerant pump is operated instead of a compressor, depending on the situation, as in Patent document 1 above. The control scheme in Patent document 3 involves switching from a compression cycle to a refrigerant pump cycle if, for instance, an outdoor air temperature is equal to or lower than a set value, or if cooling capacity is equal to or smaller than a set value (for instance, desired value of interior temperature), or if a compressor frequency is equal to or lower than a set value.

Patent document 4 is an invention relating to indirect outdoor air cooling, which involves a configuration, wherein depending on the situation, a refrigerant pump is operated instead of a compressor, as in Patent documents 1 and 3 above. The control scheme in Patent document 4 involves switching from a refrigerant pump cycle to a compression cycle if, for instance, the outdoor air temperature becomes equal to or higher than a set value, or if the interior temperature becomes equal to or higher than a set value, or if the refrigerant flow rate is abnormal.

Patent document 5 is an invention relating to indirect outdoor air cooling, which involves a configuration, wherein depending on the situation, a refrigerant pump is operated instead of a compressor, as in Patent documents 1, 3, and 4 above. The control scheme of Patent document 5 involves changing over from an indirect outdoor air cooling cycle to a vapor compression type cooling cycle when the number of times that a result of measuring a refrigerant flow rate exhibits a value not greater than a preset fixed value exceeds a predefined number of times within a predefined lapse of time.

Patent document 1: Japanese Patent No. 3354882
Patent document 2: Japanese Patent No. 4074422
Patent document 3: Japanese Patent No. 3967033
Patent document 4: Japanese Patent No. 3995825
Patent document 5: Japanese Patent No. 4145632

In the conventional technologies of Patent documents 1 to 5, the indirect outdoor air cooling capacity fails still to be maximally utilized. One cause of this is that, for instance, the schemes that are resorted to involve switching to either cycle from among two cycles, namely a compression cycle and a refrigerant pump cycle.

DISCLOSURE OF THE INVENTION

It is an object of the present invention to provide an integrated air conditioning system, and a control device and the like for the integrated air conditioning system, wherein the configured is formed to enable a combined operation of two cycles, namely an indirect outdoor air cooling cycle and a compression-type cooling cycle, wherein cooling efficiency can be enhanced by switching to either the individual operation mode or the combined operation mode, from these two cycles, depending on the situation, and by substantially optimizing the control method in each mode.

The integrated air conditioning system of the present invention has an indirect outdoor air cooler, an air conditioner, a common fan, and a control device.

The indirect outdoor air cooler has a first heat exchanger for passing through indoor air as warm air, a second heat exchanger for passing through outdoor air, and piping and a pump for circulating any fluid through the first heat exchanger and the second heat exchanger.

The air conditioner is based on a compression refrigeration cycle and has an evaporator, a compressor, and a condenser, for passing the indoor air, after having passed through the first heat exchanger, to convert to cold air.

The common fan is a fan for passing outdoor air through the second heat exchanger and the condenser.

The control device sets any mode from among a first mode for performing an individual operation of the indirect outdoor air cooler, a second mode for performing an individual operation of the air conditioner, or a third mode for performing a combined operation of the air conditioner and the indirect outdoor air cooler, to a current operation mode, and executes operation control of the air conditioner and/or the indirect outdoor air cooler in the current operation mode.

BRIEF DESCRIPTION OF THE DRAWINGS

FIGS. 7(a) to 7(c) are diagrams illustrating operation states, power consumption, and COP according to outdoor air temperature, in the case of a conventional method.

BEST MODE FOR CARRYING OUT THE INVENTION

Embodiments of the present invention are explained next with reference to accompanying drawings.

Figure 1:
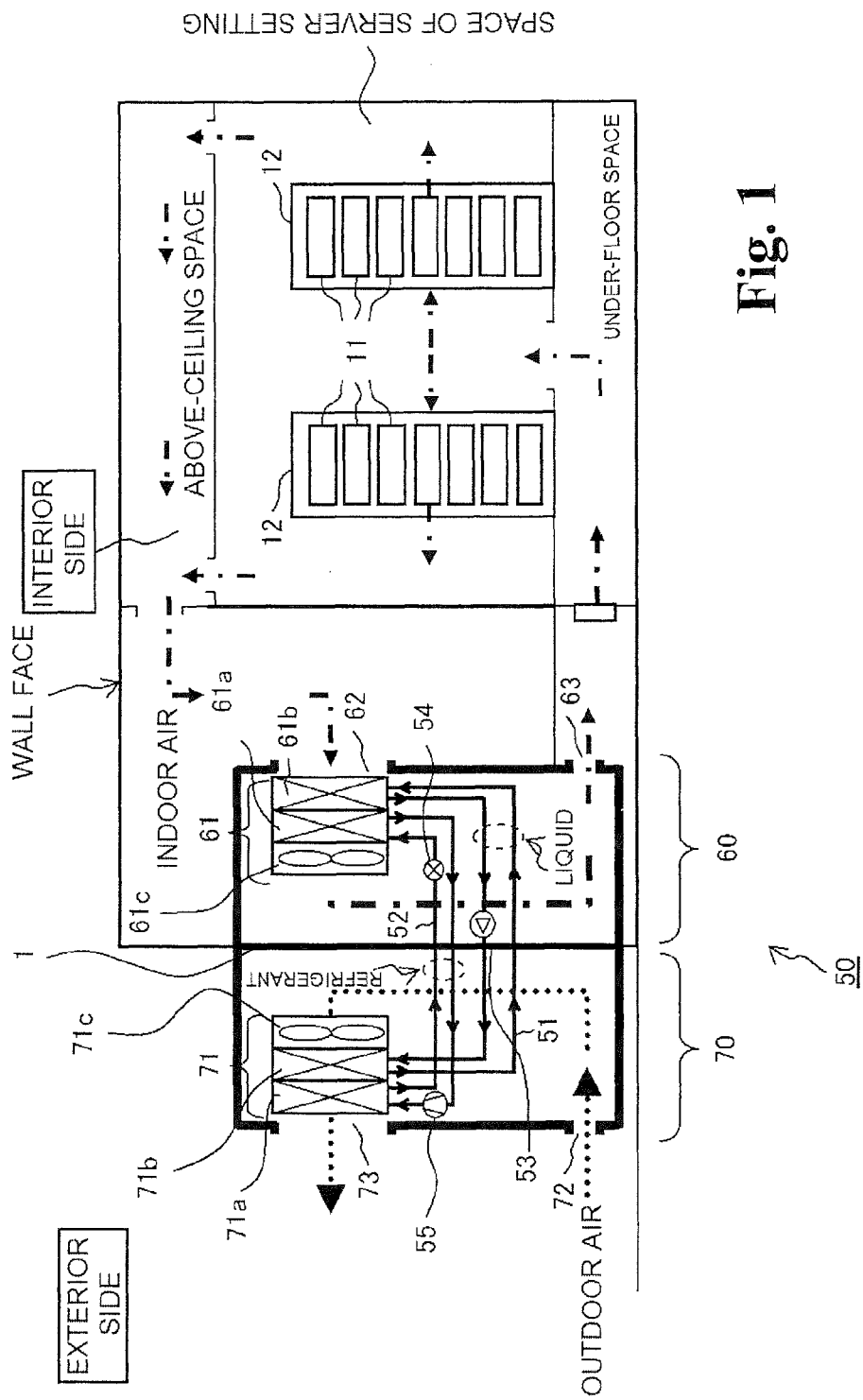
FIG. 1 is an overall configuration diagram including an integrated air conditioning system of the present example.

FIG. 1 is an overall configuration diagram including an integrated air conditioning system of the present example.

Figure 2:
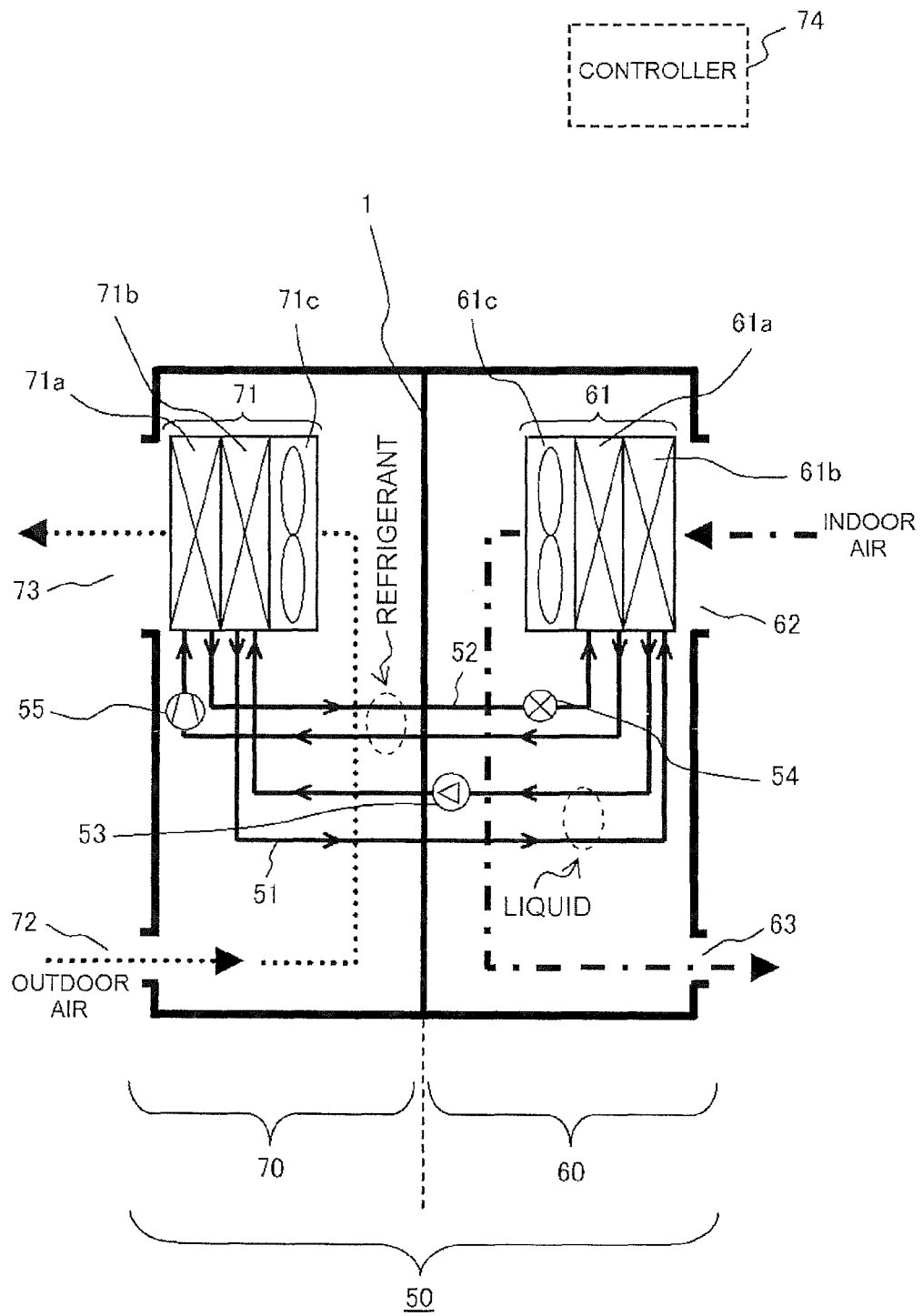
FIG. 2 is a configuration diagram (I) of the integrated air conditioning system of the present example.

FIG. 2 is an enlarged diagram of part (integrated air conditioning system) of the configuration in FIG. 1.

In the present explanation, the term "interior side" signifies "inside a building". Accordingly, the "interior side" encompasses not only an "interior space to be cooled", but also, for instance, a machine room or the like. In other words, the "interior side" may also be regarded as a space in which "indoor air" (air inside the building) is present. Similarly, the term "exterior side" in the present explanation signifies "outside a building." In other words, the "exterior side" may also be regarded as a space in which "outdoor air" (air outside the building) is present.

Herein, the term "interior space" has a somewhat different meaning from that of the "interior side", and is meant to denote basically "a space to be cooled by an integrated air conditioning system (interior space to be cooled); in a narrower sense, a space of server setting within the space to be cooled." Accordingly, the "interior space" does not encompass a machine room and so forth.

Although the air conditioning system to be controlled in accordance with the present method is not limited to the integrated air conditioning system illustrated in FIG. 1 and so forth, the explanation below will deal mainly with an example of the integrated air conditioning system.

Partitioning into inside the building (interior side) and outside the building (exterior side) is basically defined by the wall 1 illustrated in FIG. 1, as well as by wall surfaces and so forth. Air inside the building (indoor air) circulates through the interior of the building while being repeatedly brought to a cold air state and a warm air state.

Inside the building, not only the interior space, but a machine room and so forth are also present. The machine room is, for instance, a space adjacent to the interior space and linked to an under-floor space and an above-ceiling space. For instance, a below-described indoor air unit 60 or the like is installed in the machine room.

The space to be cooled by the integrated air conditioning system 50 illustrated in FIG. 1 and FIG. 2 is, for instance, a server room having installed therein multiple server racks 12 on which heating elements 11, such as server devices (computer devices) are placed. Accordingly, the integrated air conditioning system 50 operates basically all year round, also in winter. Therefore, the cooling performance of a below-described indirect outdoor air cooler is particularly high during winter, since the temperature of outdoor air is then low.

In the present example, the interior space is divided into the space of server setting, the under-floor space and the above-ceiling space, as illustrated in the figure. Needless to say, the invention is not limited to this example, which will be used in the explanation below. In this example, the space of server setting can be regarded, in a narrow sense, as the target of cooling.

The integrated air conditioning system 50 has a configuration that results from integrating a configuration as an indirect outdoor air cooler with a configuration as a general air conditioner. As illustrated in the figure, the integrated air conditioning system 50 comprises an indoor air unit 60 provided on the "interior side", and an outdoor air unit 70 provided on the "exterior side".

The integrated air conditioning system 50 (the indoor air unit 60 thereof) sends cold air to the under-floor space, and supplies cold air to the space of server setting, via the under-floor space, so that the heating elements 11 are cooled by this cold air. As a result, the cold air becomes warm air that flows thereupon into the above-ceiling space. The warm air flows thereby into the integrated air conditioning system 50 (indoor air unit 60 thereof) via the above-ceiling space, and is cooled in the indoor air unit 60, to become the cold air. This cold air is sent by the indoor air unit 60 to the under-floor space, as described above.

Schematically, the warm air that flows into the indoor air unit 60 has the temperature initially lowered by the indirect outdoor air cooler using outdoor air, and is thereafter cooled by the general air conditioner to about a predefined temperature (set temperature), to generate the cold air as a result.

In the explanation below, a high or low temperature of outdoor air does not refer to any specific values as represented by ° C., but refers to a relative temperature with respect to, for instance, the temperature of the indoor air (warm air). Conceptually, the purpose of indirect outdoor air cooling is to lower the temperature of indoor air (warm air) utilizing outdoor air. Therefore, an instance where the temperature of indoor air (warm air) can be lowered may be regarded as corresponding to a time where the temperature of outdoor air is low.

As explained above, the integrated air conditioning system 50 has a configuration that results from integrating a configuration as an indirect outdoor air cooler with a configuration as a general air conditioner.

The configuration of the indirect outdoor air cooler includes, for instance, a liquid-gas heat exchanger 61b provided inside the indoor air unit 60, a liquid-gas heat exchanger 71b provided inside the outdoor air unit 70, a circulating pump 53 and piping 51. A liquid (for instance, water) circulates through the liquid-gas heat exchanger 61b and the liquid-gas heat exchanger 71b, via the piping 51, with the circulating pump 53 as a power source. Indoor air (warm air) passes through the liquid-gas heat exchanger 61b, where heat exchange between the warm air and the liquid takes place. Outdoor air passes through the liquid-gas heat exchanger 71b, where heat exchange between the outdoor air and the liquid takes place.

That is, the indoor air (warm air) and the outdoor air exchange heat indirectly, via a liquid such as water. If the outdoor air temperature is lower than the temperature of the warm air, the latter is substantially cooled by the outdoor air, and the temperature of the warm air is lowered as a result.

The configuration of the general air conditioner includes, for instance, an evaporator 61a, a condenser 71a, an expansion valve 54, a compressor 55, refrigerant piping 52 and the like. The evaporator 61a is provided inside the indoor air unit 60, and the condenser 71a is provided inside the outdoor air unit 70. The expansion valve 54 and the compressor 55 may be provided in either the indoor air unit 60 or the outdoor air unit 70. A refrigerant circulates through the evaporator 61a, the condenser 71a, the expansion valve 54 and the compressor 55, via the refrigerant piping 52. The indoor air (warm air) having passed through the liquid-gas heat exchanger 61b passes thereafter through the evaporator 61a. Outdoor air having passed through the liquid-gas heat exchanger 71b passes thereafter through the condenser 71a.

The configuration as the general air conditioner is that of an air conditioner that is based on an ordinary compression refrigeration cycle, and will not be explained in particular detail herein. Briefly, indoor air (warm air) having passed unit the liquid-gas heat exchanger 61b is cooled thereafter by the refrigerant, in the evaporator 61a, which is one kind of heat exchanger, and becomes the cold air. The temperature of cold air is adjusted and controlled, by a control device or the like, not shown, so as to become substantially a set temperature. The refrigerant is cooled in the condenser 71a, which is a kind of heat exchanger, by the outdoor air having passed through the liquid-gas heat exchanger 71b.

In any case, power consumption in an air conditioner relying on an ordinary compression refrigeration cycle, in particular the power consumption incurred by the compressor 55, is substantial, and hence power consumption is greater also than that of an indirect outdoor air cooler.

As a shared feature of the indirect outdoor air cooler and the general air conditioner, a fan 71c is provided inside the outdoor air unit 70, and a fan 61c is provided inside the indoor air unit 60. The fan 71c causes outdoor air to pass through the outdoor air unit 70, for instance as denoted by the dotted line arrow in the figure; as a result, the outdoor air passes through the liquid-gas heat exchanger 71b, and thereafter through the condenser 71a. The fan 61c causes indoor air to pass for through the indoor air unit 60, for instance as denoted by the dot-chain line arrow in the figure; as a result, the indoor air passes through the liquid-gas heat exchanger 61b, and thereafter through the evaporator 61a. The above features are explained in more detail further on.

In the configuration of the integrated air conditioning system 50, the outdoor air and the indoor air exchange heat while being cut-off from each other. Accordingly, humidity, dust and corrosive gases in the outdoor air are not taken up into the interior space. The reliability of electronic devices such as the servers is thus preserved.

An explanation follows next, for instance, on the method for installing the integrated air conditioning system 50 (the indoor air unit 60 and the outdoor air unit 70 thereof).

The indoor air unit 60 and the outdoor air unit 70 are for instance produced separately in respective factories, and are thereafter installed in such a way so as to close contact the wall faces of the wall 1, as illustrated in the figure. As described above, the exterior side (outside the building) and the interior side (inside the building) are separated with the wall 1 as a boundary; however, the outdoor air unit 70 is installed on the exterior side and the indoor air unit 60 being installed on the interior side. That is, the outdoor air unit 70 being installed in such a manner that a housing thereof is close contacting the exterior-side wall face of the wall 1. The indoor air unit 60 is installed in such a manner that a housing thereof is close contacting the interior-side wall face of the wall 1.

Preferably, the outdoor air unit 70 and the indoor air unit 60 are provided at mutually corresponding positions across the wall 1. Herein, mutually corresponding positions across the wall 1 denote positions such as those illustrated in, for instance, FIG. 1 and FIG. 2, for instance positions such that the indoor air unit 60 is present on the rear face of the wall 1, as viewed from the side of the outdoor air unit 70. In other words, if the shapes and sizes of the housing of the outdoor air unit 70 and of the housing of the indoor air unit 60 are substantially identical, as in the figures, then the two housings are disposed, as illustrated in the figure, to be in a substantially symmetrical relationship (substantial left-right symmetry in the figures) with the wall 1 sandwiched between the housings. Needless to say, the arrangement is not limited to such an example, but fundamentally the units are manufactured and installed in such a way so as to reduce production costs, facilitate installation, and reduce piping length.

The piping 51, the refrigerant piping 52 and so forth illustrated in the figures are installed, accompanying the installation of the outdoor air unit 70 and the indoor air unit 60, to configure as a result the integrated air conditioning system 50. Setting of the piping may involve connecting (by welding or the like) pipes produced substantially in halves. Through-holes must be drilled in the wall 1 in order to install the piping 51 and the refrigerant piping 52. In the example illustrated in figures these through-holes are provided at four sites, but the through-holes are not limited to such an example.

In the present example, the indoor air unit 60 has for instance a stack 61. The stack 61 has, for instance, the evaporator 61a, the liquid-gas heat exchanger 61b, the fan 61c and so forth, and is configured through integral stacking of the foregoing, as illustrated in the figures. A configuration wherein an evaporator, a liquid-gas heat exchanger and a fan are thus integrally stacked is fairly advantageous, but the configuration is not limited to that in the example. That is, the evaporator 61a, the liquid-gas heat exchanger 61b and the fan 61c may be individually installed, separated from each other, at respective arbitrary positions inside the indoor air unit 60.

Holes for an indoor air inlet 62, an indoor air outlet 63 and so forth illustrated in the figures are opened in the housing (which takes for instance the form of a box having one open face) of the indoor air unit 60. The fan 61c creates flow of air (denoted by a dot-chain line arrow in the figure) such that the warm air in the above-ceiling space flows into the unit 60 through the indoor air inlet 62 to pass through the indoor air unit 60 (in particular, through the stack 61), and to be discharged thereafter through the indoor air outlet 63.

The stack 61 is configured in such a manner that the liquid-gas heat exchanger 61b is provided on the upstream side of such air flow, and the evaporator 61a is provided on the downstream side. In other words, the stack 61 is configured in such a manner that the indoor air (warm air) passes firstly through the liquid-gas heat exchanger 61b and thereafter through the evaporator 61a. Accordingly, the stack 61 is not limited to the configuration example illustrated in the figure, and may be configured differently, so long as the above condition is satisfied.

Although not particularly depicted in the figures, a configuration must be adopted wherein the liquid-gas heat exchanger is provided on the upstream side of air flow and the evaporator on the downstream side, even without a stack. That is, a configuration must be adopted wherein the indoor air (warm air) has the temperature thereof lowered in the liquid-gas heat exchanger that utilizes outdoor air, and is thereafter brought to a predefined temperature (set temperature) in the evaporator.

The above feature applies to the relative positional relationship between the liquid-gas heat exchanger 61b and the evaporator 61a. The fan 61c may be set at any position (arrangement order with respect to the flow of air) in the stack 61. That is, the fan 61c may be positioned at the furthest upstream position of the flow of air, or at the furthest downstream position, or at an intermediate position (between the liquid-gas heat exchanger 61b and the evaporator 61a). The same is true of an instance without a stack.

Preferably, the evaporator 61a is disposed as close as possible to an outlet (indoor air outlet 63).

The outdoor air unit 70 has for instance a stack 71. The stack 71 has, for instance, the condenser 71a, the liquid-gas heat exchanger 71b, the fan 71c and so forth, such that the stack 71 is configured through integral stacking of the foregoing, as illustrated in the figures. As in the case of the indoor air unit 60, however, the outdoor air unit 70 is not necessarily limited to an example where a stack is resorted to. As in the case of the indoor air unit 60, the condenser 71a, the liquid-gas heat exchanger 71b and the fan 71c may be installed individually and separately from each other at respective arbitrary positions inside the outdoor air unit 70.

Holes such as an outdoor air intake port 72 and an outdoor air outlet 73 illustrated in the figure are opened in, for instance, the housing of the outdoor air unit 70. The fan 71c creates flow of air (denoted by a dotted line arrow in the figure) such that outdoor air flows into the unit 70 through the outdoor air intake port 72 to pass through the outdoor air unit 70 (in particular, through the stack 71), and to be discharged thereafter through the outdoor air outlet 73.

Preferably, the stack 71 is configured in such a manner that the liquid-gas heat exchanger 71b is provided on the upstream side of such air flow, and the condenser 71a is provided on the downstream side. In the case of stack 71, like the stack 61, the position (arrangement order with respect to the flow of air) of the fan 71c may be any position (accordingly, the stack 71 is not limited to the configuration example illustrated in the figure, and may be configured differently, so long as the above condition is satisfied). The same is true of an instance where no stack is resorted to.

Preferably, the liquid-gas heat exchanger is provided on the upstream side of air flow, and the condenser is provided on the downstream side, even if the configuration involves no stack.

As indicated above, the configurations of the indoor air unit 60 and the outdoor air unit 70 as depicted in FIG. 1 and FIG. 2 are illustrative examples, and are not limited to these examples.

The stacks 61, 71 may involve various structures and manufacturing methods in which a detailed explanation will not be provided herein; however, a compact configuration and ease of manufacture are preferable. Taking for instance the stack 61 as an example, the evaporator 61a, the liquid-gas heat exchanger 61b and the fan 61c may conceivably be designed to fit all into any given housing (unitization), and to have sizes and shapes that match substantially those of the housing. In a conceivable example, for instance, the shape of the housing is set to a substantially rectangular parallelepiped shape, such that the shape of the stack 61 resulting from stacking these three parallelepipeds is accordingly a substantially parallelepiped shape.

In the present example, stacking and integration of the evaporator 61a, the liquid-gas heat exchanger 61b and the fan 61c (i.e. formation of the stack 61) are accomplished, for instance, by connecting the respective housings to each other. Connection of the housings to each other may be accomplished in accordance with an ordinary method, for instance fixing of the housings by way of nuts as well as rods and bolts that are inserted through holes provided at the corners of the housings.

Needless to say, the housings are provided with multiple holes for enabling passage of indoor air, as well as with holes through which various types of piping are laid.

The configuration as the indirect outdoor air cooler and the configuration as the general air conditioner will be explained in further detail next with reference mainly to FIG. 2.

Firstly, regarding the indirect outdoor air cooler, the liquid-gas heat exchanger 61b and the liquid-gas heat exchanger 71b are connected to each other via the piping 51. The circulating pump 53 causes a liquid (water or the like) in the piping 51 to circulate through the liquid-gas heat exchanger 61b, the liquid-gas heat exchanger 71b and the piping 51. The liquid-gas heat exchanger 61b and the liquid-gas heat exchanger 71b are structures of existing heat exchangers, and will not be explained in particular detail.

The liquid and the indoor air (warm air) pass through the liquid-gas heat exchanger 61b. As a result, the liquid and the warm air exchange heat inside the liquid-gas heat exchanger 61b; basically, the warm air is cooled by the liquid, and the temperature of the warm air is lowered thereby. The above occurrence depends on the temperature of the outdoor air and of the warm air, and there is no assurance that the temperature of the warm air will drop. Conceivably, for instance, the indirect outdoor air cooler is substantially stopped, for example, through stopping of the circulating pump 53, to cope at times of high temperature of the outdoor air.

Regarding the general air conditioner, the evaporator 61a, the condenser 71a, the expansion valve 54 and the compressor 55 are connected to the refrigerant piping 52, as described above. The refrigerant circulates through the evaporator 61a, the condenser 71a, the expansion valve 54 and the compressor 55, via the refrigerant piping 52. That is, the refrigerant circulates in accordance with an ordinary compression refrigeration cycle (for instance, vapor compression refrigeration cycle or the like) namely "evaporator 61a→compressor 55→condenser 71a→expansion valve 54→evaporator 61a". In the evaporator 61a, the refrigerant evaporates and, in doing so, robs heat from the surroundings, and the latter are cooled as a result. The robbed heat is dumped for instance into the outdoor air, in the condenser 71a. These functions are all conventional ones. The functions of the expansion valve 54 and the compressor 55 are likewise conventional, and will not be explained in particular.

As illustrated in the figure, the expansion valve 54 is provided in the in the indoor air unit 60, but may be provided in the outdoor air unit 70. The compressor 55 is provided inside the outdoor air unit 70, but may be provided inside the indoor air unit 60. That is, configurations that can be resorted to include a configuration wherein the expansion valve 54 is provided inside the indoor air unit 60 and the compressor 55 is provided in the outdoor air unit 70, a configuration wherein the expansion valve 54 is provided inside the outdoor air unit 70 and the compressor 55 is provided inside the indoor air unit 60, a configuration wherein both the expansion valve 54 and the compressor 55 are provided inside the indoor air unit 60, and a configuration wherein both the expansion valve 54 and the compressor 55 are provided inside the outdoor air unit 70.

In the example illustrated in the figure, the circulating pump 53 is provided in the indoor air unit 60, but may be provided in the outdoor air unit 70.

The liquid-gas heat exchanger 61b and the liquid-gas heat exchanger 71b are heat exchangers in which heat exchange is performed between a liquid and a gas, but the heat exchangers are not limited thereto. For instance, heat exchangers wherein heat exchange takes place between a gas and a gas (so called gas-gas heat exchangers) may be provided instead of the liquid-gas heat exchangers. In such a case a gas is naturally used instead of the liquid.

If such liquids and gases are referred to collectively as "fluids," then the liquid-gas heat exchangers and the gas-gas heat exchangers may be referred to collectively as, for instance, fluid-gas heat exchangers or fluid-fluid heat exchangers. It is found that, in that case, a "fluid" flows in the piping 51. Specifically, it is found that any "fluid" is caused to circulate, via the piping 51, through two heat exchangers (in the example illustrated in the figures, the liquid-gas heat exchanger 61b and the liquid-gas heat exchanger 71b, although as pointed out above, the structure is not limited to this example).

Various configurations of the integrated air conditioning system 50 have been explained in detail.

The operation of the integrated air conditioning system 50 configured as described above will be explained in detail next.

Specifically, when the indoor air (warm air) in the above-ceiling space flows into the indoor air unit 60 via the indoor air inlet 62, the warm air passes first through the liquid-gas heat exchanger 61b, and as a result, heat exchange takes place between the warm air and the liquid, and basically the temperature of the warm air drops. The degree of drop in the temperature of the warm air depends on the outdoor air temperature (temperature of the liquid) and on the temperature of the warm air.

The warm air having had the temperature thereof lowered passes next through the evaporator 61a. As a result, the warm air having had the temperature thereof lowered is further cooled, and has the temperature thereof further lowered, at the evaporator 61a, to become cold air. This cold air is controlled so as to take on a predefined temperature (set temperature). Thus, a controller 74 illustrated in FIG. 2 is obviously present. The controller 74, which controls the integrated air conditioning system 50 as a whole, performs various control items that will not be explained herein, such as rotational speed control of the fans and control of the circulating pump 53.

The controller 74 has a computing device such as a CPU and a storage device such as a memory. The controller 74 controls the integrated air conditioning system 50 (for instance, according to the process in the flowchart of FIG. 6), by executing a program stored beforehand in the memory or the like, and through input, at any time, of measurement values from various sensors, not shown. This control process, which will be explained further on with reference to FIG. 3 onwards, involves basically control in such a manner that a more pronounced energy saving effect is achieved.

The controller 74 may be provided inside the housing of the indoor air unit 60, or inside the housing of the outdoor air unit 70, or outside these units (for instance, in the vicinity of the units). Although FIG. 2 and so forth do not illustrate the various signal lines and the like associated with the controller 74, these signals and the like are actually present, and the controller 74 controls the various structures of the integrated air conditioning system 50 and so forth via signal lines.

For instance, there is provided a temperature sensor, not shown, that measures the temperature of the cold air generated in the evaporator 61a, such that the controller 74 acquires, via a signal line not shown, the temperature that is measured by the temperature sensor. The controller 74 controls the various structures of the integrated air conditioning system 50 via signal lines, not shown, in such a manner that the measured temperature becomes substantially the set temperature.

As indicated above, the liquid-gas heat exchanger 61b in the present example is disposed on the upstream side of the flow of warm air, and the evaporator 61a is disposed on the downstream side.

The cold air generated in the evaporator 61a is discharged through the indoor air outlet 63. As illustrated in FIG. 1, the indoor air outlet 63 is disposed so as to be linked to the under-floor space. Accordingly, the indoor air unit 60 of the integrated air conditioning system 50 is installed in such a manner that part of the housing thereof is provided under the floor, as illustrated in FIG. 1. The cold air discharged through the indoor air outlet 63 flows into the space of server setting via the under-floor space, and cools the heating elements 11. The cold air becomes warm air through cooling of the heating elements 11. This warm air flows into the above-ceiling space, and flows again through the indoor air inlet 62 into the indoor air unit 60.

Regarding the outdoor air unit 70, the outdoor air that flows into the outdoor air unit 70 via the outdoor air intake port 72 passes firstly through the liquid-gas heat exchanger 71b, as a result of which the outdoor air exchanges heat with the liquid. The temperature of the liquid is raised in the liquid-gas heat exchanger 61b as a result of heat exchange with the warm air. The liquid having had the temperature thereof thus raised exchanges heat with the outdoor air, and the temperature of the liquid basically drops as a result. The liquid having had the temperature thereof lowered is supplied again towards the liquid-gas heat exchanger 61b, by way of the circulating pump 53 and the piping 51.

The temperature of the outdoor air is raised through heat exchange with the liquid when passing through the liquid-gas heat exchanger 71b. The outdoor air having the temperature thereof raised passes next through the condenser 71a, and the temperature of the outdoor air rises further on account of the heat dumped by the condenser 71a, as described above. The outdoor air is discharged thereafter through the outdoor air outlet 73.

The integrated air conditioning system 50 explained above elicits mainly the effects below.

(a) Greater Compactness

Two devices, namely the general air conditioner and the indirect outdoor air cooler are integrated as one (hence the denomination integrated air conditioning system). As a result, this allows reducing the overall size, and, thereby, reducing installation space, and facilitating installation also in cases where a machine room or the like is small (or, alternatively, enabling installation in spaces so small that preclude installation in conventional instances).

(b) Reduction in Construction Costs from Duct-Less Wall Mounting

No ducts, such as those of conventional art, need be provided herein. The indoor air unit and the outdoor air unit are manufactured beforehand, for instance in a factory; during construction, the units are simply mounted to wall faces (work is required for instance in terms of drilling holes for piping and holes for embedding the integrated indoor and outdoor air units). Therefore, construction time can be shortened, and conduction costs can be accordingly reduced.

(c) Enhanced Compactness and Manufacturability Through Stacking

Reductions in size can be achieved by overlaying the evaporator/condenser, liquid-gas heat exchangers and fans, and forming an integral stack. Manufacturing is made easier since the foregoing are not manufactured individually but together. In particular, manufacturability can be expected to be further enhanced by unifying shapes and sizes to be substantially identical, as illustrated in FIG. 1 and FIG. 2. Other envisaged effects include convenience during transport of the equipment, and ease of installation of the latter.

(d) Reduction in Blower Motive Power (Blower Electric Power) and Reduction in Costs Through Sharing of Fans A common fan can be provided in the general air conditioner and in the indirect outdoor air cooler. Therefore, this allows reducing the number of fans, and in consequence, achieving reductions in blower motive power (blower electric power) and in cost. The number of fans can be basically halved, and for instance, the cost of purchasing the fans can be halved as a result. Although power is still required for fan operation, less power suffices herein.

The configuration described above enables a combined operation of the indirect outdoor air cooler and a refrigerator (general air conditioner). In terms of energy saving, an instance may however arise wherein individual operation of either of the foregoing is better than a combined operation of both. In the present method there is switched, in accordance with the control method described below, between modes of individual operation of either one of the foregoing two (indirect outdoor air cooler and general air conditioner) and modes that involve operation of both (combined operation modes), as the situation demands. The indirect outdoor air cooling capacity and the energy saving effects can be maximized, with enhanced cooling efficiency through appropriate switching between modes and appropriate operation control in each mode.

Accordingly, operation modes are switched as a result of, for instance, computationally estimating an indirect outdoor air cooling capacity Q, as described below, and comparing the latter with a set value (which is not limited to a fixed value and may be a dynamically established value).

For instance, in a combined operation mode of the indirect outdoor air cooler and the general air conditioner (refrigerator operation), the operation of the indirect outdoor air cooler, which boasts high efficiency, can be maximally utilized, while the general air conditioner (refrigerator operation) is used in an auxiliary role (maximal utilization of the indirect outdoor air cooling capacity).

A control method in which the above configurations are resorted to will be explained next.

As explained above, a plurality of modes is used in the present control method.

Four modes are pre-defined in the examples below. Specifically, there are defined four modes, namely mode A, mode B, mode C and mode D. The particulars of operation control in each mode are as described further below.

As described above, the integrated air cooling system 50 has a configuration in which an indirect outdoor air cooler and a general air conditioner (refrigerator operation) are integrated together. The operation of the indirect outdoor air cooler and the operation of the general air conditioner can be controlled individually. Specifically, control is not limited to an instance where the indirect outdoor air cooler and the general air conditioner are both operated; herein, the indirect outdoor air cooler may be operated alone, or conversely, the general air conditioner may be operated alone. The respective operation modes below are accordingly defined.

The operation control features of each operation mode, as well as mode switching control, will be explained with reference to mainly to FIG. 3 to FIG. 6.

Figure 3:
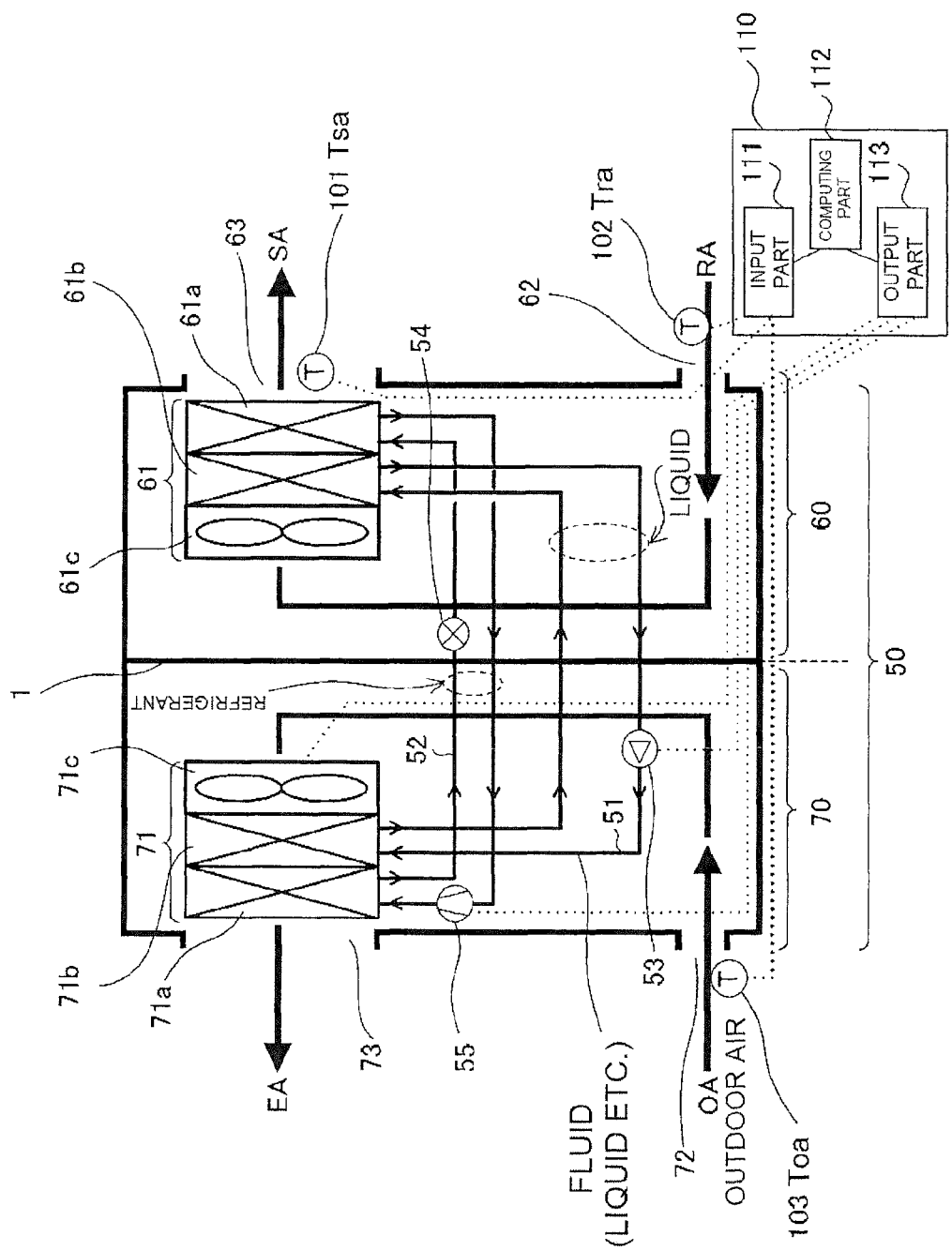
FIG. 3 is a configuration diagram (II) of the integrated air conditioning system of the present example.

FIG. 3 is a configuration diagram (II) of the integrated air conditioning system of the present example.

The main purpose of FIG. 3 is to illustrate, for instance, sensors (thermometers) and control devices. The configuration itself of the integrated air conditioning system 50 (indoor air unit 60 and outdoor air unit 70) may be identical to those illustrated in FIG. 1 and FIG. 2 (FIG. 3, however, illustrates a configuration example somewhat different from that of FIG. 1 and so forth). FIG. 3 will be explained further on.

Figure 4:
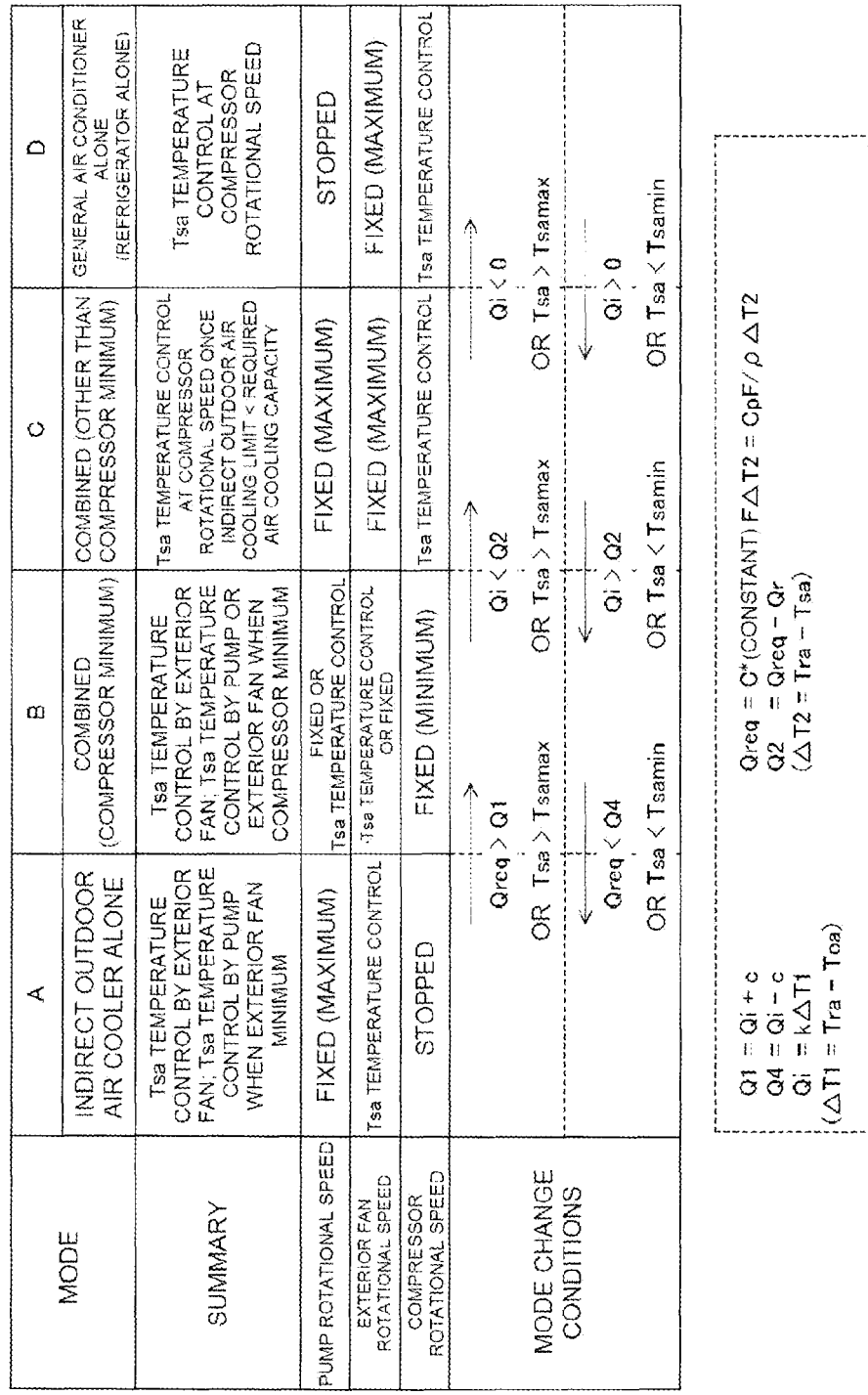
FIG. 4 is a diagram for explaining operation control in each operation mode, and for explaining mode switching control.

FIG. 4 is a diagram for explaining operation control in each operation mode, and for explaining mode switching control.

A maximum rotational speed and a minimum rotational speed in the explanation below are determined for each device (product), and therefore no specific numerical values can be given for the speeds.

(a) Mode A: mode wherein the indirect outdoor air cooler is set to individual operation.

Specifically, mode A is a mode in which the operation of the general air conditioner is paused (at least, the compressor 55 is stopped), and only the indirect outdoor air cooler operates.

FIG. 4 illustrates a below-described second mode, but mode A may be regarded as divisible into two further modes. Specifically, mode A has a first mode and a second mode. The first mode, which assumes individual operation of the indirect outdoor air cooler, involves setting the rotational speed of the exterior fan (fan 71c) to a fixed minimum rotational speed, and controlling thereupon the rotational speed of the circulating pump 53, to supply thereby the required cooling capacity.

The second mode, which also assumes the individual operation of the indirect outdoor air cooler, involves setting a fixed maximum rotational speed of the rotational speed of the circulating pump 53 and controlling thereupon the rotational speed of the exterior fan (fan 71c) to supply thereby the required cooling capacity.

Although it is not limited to the above example, it is preferable, from the viewpoint of energy saving, to resort to a method (i.e. the above second mode) wherein the circulating pump 53, the power consumption whereof is relatively low, is used, and the fan 71c is used subsequently once the circulating pump 53 is running at full capacity, since, ordinarily, there holds "fan power consumption>pump power consumption".

(b) Mode B: mode wherein both the indirect outdoor air cooler and the general air conditioner are operated.

Herein, the general air conditioner is operated at the minimum capacity (the compressor rotational speed is set to a fixed minimum rotational speed). Thereupon, the operation of the indirect outdoor air cooler is controlled to supply thereby the required cooling capacity. Operation control of the indirect outdoor air cooler involves for instance, although not limited to this example, setting the rotational speed of the circulating pump 53 to a fixed maximum rotational speed, and controlling then the rotational speed of the exterior fan (fan 71c).

Specifically, the rotational speed of the exterior fan (fan 71c) may be set to a fixed maximum rotational speed, whereupon the rotational speed of the circulating pump 53 is controlled to supply thereby the required cooling capacity. Alternatively, the rotational speeds of both the circulating pump 53 and the fan 71c may be adjusted and controlled as appropriate, without the rotational speeds being set to a fixed value.

(c) Mode C: mode wherein, as in mode B, both the indirect outdoor air cooler and the general air conditioner are operated.

Herein, the indirect outdoor air cooler operates at maximum capacity (for instance, at fixed maximum rotational speeds of both the circulating pump 53 and the fan 71c). The operation in the general air conditioner is controlled thereupon (in particular, the rotational speed of the compressor 55 is controlled) to supply as a result the required cooling capacity. In other words, a restriction "general air conditioner operates at the minimum capacity", such as the one in mode B, does not apply to mode C.

(d) Node D: mode wherein the general air conditioner operates independently.

Specifically, the operation of the indirect outdoor air cooler is paused (the circulating pump 53 is stopped. In this mode, the fan 71c operates without change (since it is shared with the general air conditioner), and the operation of the general air conditioner is controlled (in particular, the rotational speed of the compressor 55 is controlled) to supply thereby the required cooling capacity.

In the above modes A, B, C, and D, a current mode is changed over to a next mode in accordance with a predefined condition. There are six mode change patterns, namely mode A→mode B, mode B→mode C, mode C→mode D, and mode A←mode B, mode B←mode C, and mode C←mode D. Although it is not limited to the above example, and for instance the above-described mode A may encompass further mode changes, the explanation will focus on the above six types.

The above mode changes are explained next.

Firstly, the temperature of indoor air (warm air) RA that is taken into the indoor air unit 60 will be notated as Tra, and the temperature of indoor air (cold air) SA sent from the indoor air unit 60 will be notated as Tsa. Regarding outdoor air, the temperature of outdoor air OA taken into the outdoor air unit 70 will be notated as Toa, the temperature of exhaust EA discharged through the outdoor air unit 70 will be notated as Tea (in the configuration example of FIG. 3, however, the exhaust temperature Tea is not measured).

In the present example, for instance, there are provided three thermometers 101, 102, 103 for measuring the warm air temperature Tra, the cold air temperature Tsa and the outdoor air intake temperature Toa, as illustrated in FIG. 3. Specifically, the thermometer 101, which is provided in the vicinity of the indoor air outlet 63, measures the cold air temperature Tsa. The thermometer 102, which is provided in the vicinity of the indoor air inlet 62, measures the warm air temperature Tra. The thermometer 103, which is provided in the vicinity of the outdoor air intake port 72, measures the outdoor air temperature (outdoor air intake temperature) Toa.

In the example of FIG. 3, a control device 110 as well is provided as an example of the controller 74. The control device 110 has various functional parts, namely an input part 111, a computing part 112, and an output part 113. The computing part 112 acquires, via the input part 111, the warm air temperature Tra, the cold air temperature Tsa, and the outdoor air intake temperature Toa from the respective thermometers 101, 102, 103, for instance at predefined periods. Needless to say, the input part 111 is connected to the three thermometers 101, 102, 103 by way of communication lines (for instance, serial lines, denoted by dotted lines in the figure).

The computing part 112 adjusts and controls, via the output part 113, the various structures of the integrated air conditioning system 50. In the present example, the structures to be controlled are mainly the various structures corresponding to the output part 113, namely the fan 71c, the compressor 55, and the circulating pump 53, but other structures are controlled as well. Needless to say, the output part 113 is connected to the fan 71c, the compressor 55, the circulating pump 53 and so forth by way of communication lines (for instance, serial lines, denoted by dotted lines in the figure).

The computing part 112 performs various computations on the basis of, for instance, measurement results such as the warm air temperature Tra, the cold air temperature Tsa, the outdoor air intake temperature Toa and the like, and on the basis of the current mode. In accordance with the obtained results, and depending on the situation (including mode determination/change results), the computing part 112 for instance controls switching on/off (operation/stop) of the fan 71c, the compressor 55, circulating pump 53 and so forth, and controls to the rotational speed of the foregoing. Although not particularly depicted in the figures, the computing part 112 for instance has a computing processor such as a CPU/MPU, and a storage part such as a memory. The storage part, not shown, has stored therein beforehand a predefined application program. The computing processor, not shown, reads and executes the application program, to realize as a result, for instance, the various computations above, various adjustment and control processes, as well as the process in the flowchart of FIG. 6, which will be described in detail further on.

The control device 110 controls, for instance, the rotational speed of the circulating pump 53, the rotational speed of the fan 71c, and the rotational speed of the compressor 55 in such a manner that the cold air temperature Tsa lies within a predefined range based on a set value, regardless of the current operation mode is in mode A, mode B, mode C, or mode D.

Figure 9:
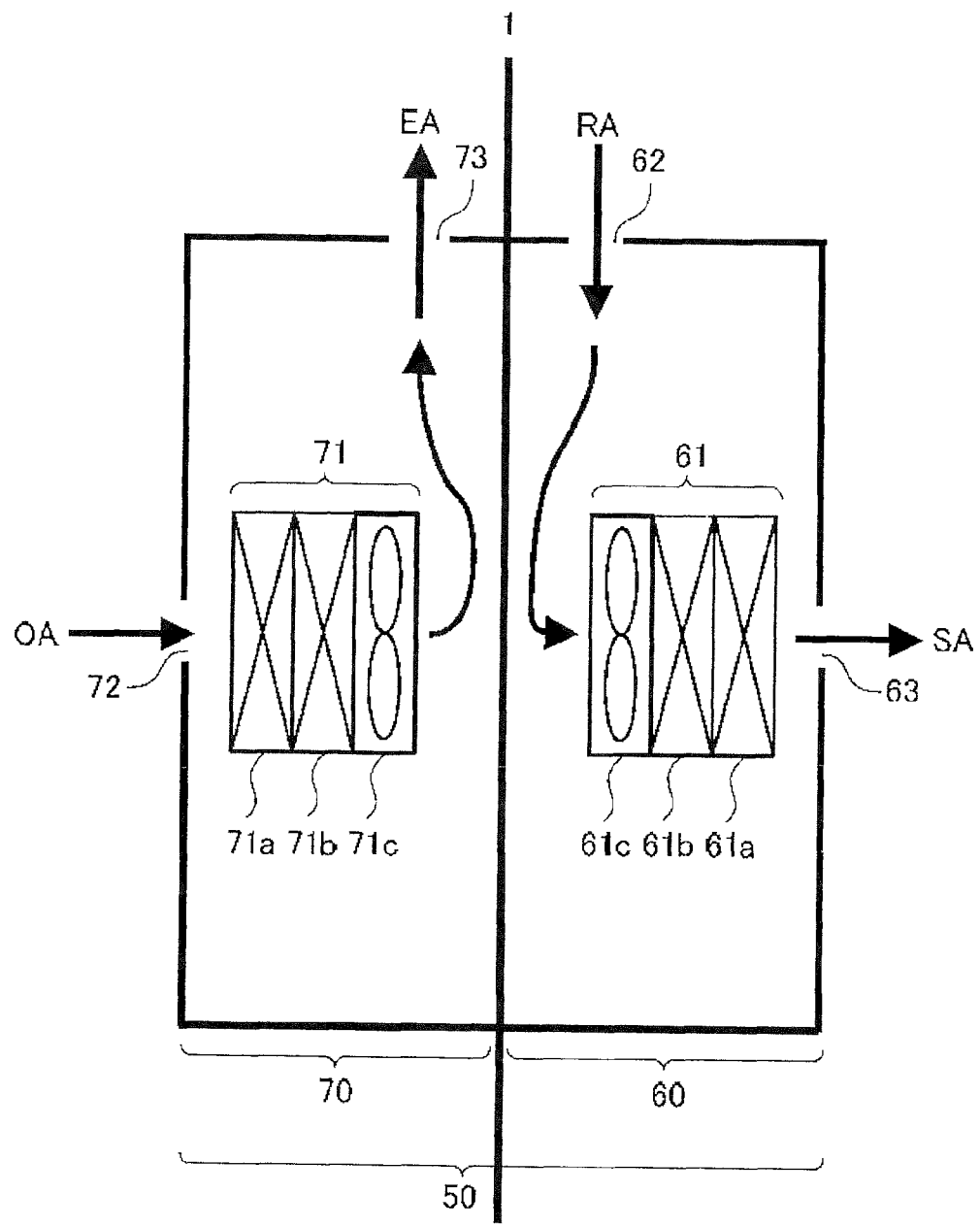
FIG. 9 is a schematic configuration diagram of another configuration of the integrated air conditioning system of the present example.

The integrated air conditioning system 50 (indoor air unit 60 and outdoor air unit 70 thereof) illustrated in FIG. 3 differs slightly from the integrated air conditioning system 50 illustrated in FIG. 1, FIG. 2 and so forth, but as indicated above, the configuration examples illustrated in FIG. 1 and FIG. 2 are not limiting, and it suffices that the above-described conditions be satisfied. The configuration illustrated in FIG. 3 may be adopted accordingly. The configuration of FIG. 9 may be alternatively adopted. FIG. 9 illustrates only the positional relationship between the stack 61 and the stack 71, and between the indoor air inlet 62, the indoor air outlet 63, the outdoor air intake port 72, and the outdoor air outlet 73.

In the example illustrated in FIG. 9, the indoor air inlet 62 is provided on the top face of the housing of the indoor air unit 60, the indoor air outlet 63 is provided around the middle of the front face of the housing, and the stack 61 is provided in the vicinity of the indoor air outlet 63. In particular, the evaporator 61a is provided in the vicinity the indoor air outlet 63.

The outdoor air outlet 73 is provided on the top face of the housing of the outdoor air unit 70, the outdoor air intake port 72 is provided around the middle of the front face of the housing, and the stack 71 is provided in the vicinity of the outdoor air outlet 73.

The mode change conditions of FIG. 4 and the cooling capacities (Q) illustrated in FIGS. 5(a), 5(b), FIG. 6, and FIG. 8 are explained in detail next.

The following definitions apply:
$\Delta T1 = Tra - Toa$ (temperature difference between warm air and outdoor air)
$\Delta T2 = Tra - Tsa$ (temperature difference between warm air and cold air).

Accordingly, a maximum cooling capacity Q(Qi) of the indirect outdoor air cooler is calculated in accordance with the expression below.

$$Qi = k\Delta T1$$

(where k denotes an arbitrary coefficient, determined beforehand, for instance, on the basis of experimental results and the like)

A required cooling capacity Qreq is calculated in accordance with the expression below.

$$Qreq = C^*(\text{constant})F\Delta T2 = CpF/\rho\Delta T2$$

(where $C^* = Cp/\rho$, Cp: specific heat at constant pressure, and $\rho$: air density; further, F is the flow rate (air volume) of indoor air, and is calculated for instance on the basis of the volume of air that passes through the evaporator, and on the basis of the rotational speed of the fan 61c; the foregoing involve existing calculation methods, and hence an explanation thereof will be omitted; instances of operation at an arbitrary fixed air volume are not numerous, and hence the air volume F is known beforehand, and it suffices to store beforehand the value of the air volume F in such cases)

Further, there holds Q1=Qi+c and Q4=Qi−c (c: arbitrary constant set beforehand).

It is not limited to this example, and for instance the following definitions are also possible, as described below: Q1=Qreq−c, and Q4=Qreq+c (c: arbitrary constant set beforehand). This will be explained in detail further on. The instance in FIG. 6 described below corresponds to the latter definition.

Further, there holds Q2=Qreq−Qr (where Qr is the minimum cooling capacity of the general air conditioner, i.e. the cooling capacity of the general air conditioner at the time of operation with the rotational speed of the compressor 55 at the minimum rotational speed; accordingly, although the value of Qr varies for each device (product), the value is known in advance, and is hence stored beforehand).

Herein, Qr above can be regarded as the cooling capacity of the general air conditioner at the time of operation in mode B.

Further, Q2 above denotes the cooling capacity to be supplied by the indirect outdoor air cooler in mode B. Accordingly, once Qi<Q2 holds, then "cooling capacity of the indirect outdoor air cooler+cooling capacity Qr of the general air conditioner" becomes lower than the required cooling capacity Qreq, even if the indirect outdoor air cooler is set to operate at the maximum capacity, and hence it becomes impossible to supply the required cooling capacity. In this case, therefore, mode B is changed to mode C, as described below.

The values Q1, Q2, Q4 may be regarded as threshold values that are determined dynamically. By contrast, Q3 is a fixed threshold value set beforehand, and is set, although not limited thereto, to Q3=0 in the present example. The purpose of using two values Q1, Q4 in mode change determination between mode A and mode B is to avoid the occurrence of hunting, but it is not limited to this example. The power consumptions of the compressor 55, the fan 71c, and the circulating pump 53 exhibit the following relationship relative to each other:

"compressor 55≫fan 71c>circulating pump 53".

Figures 5A, 5B:
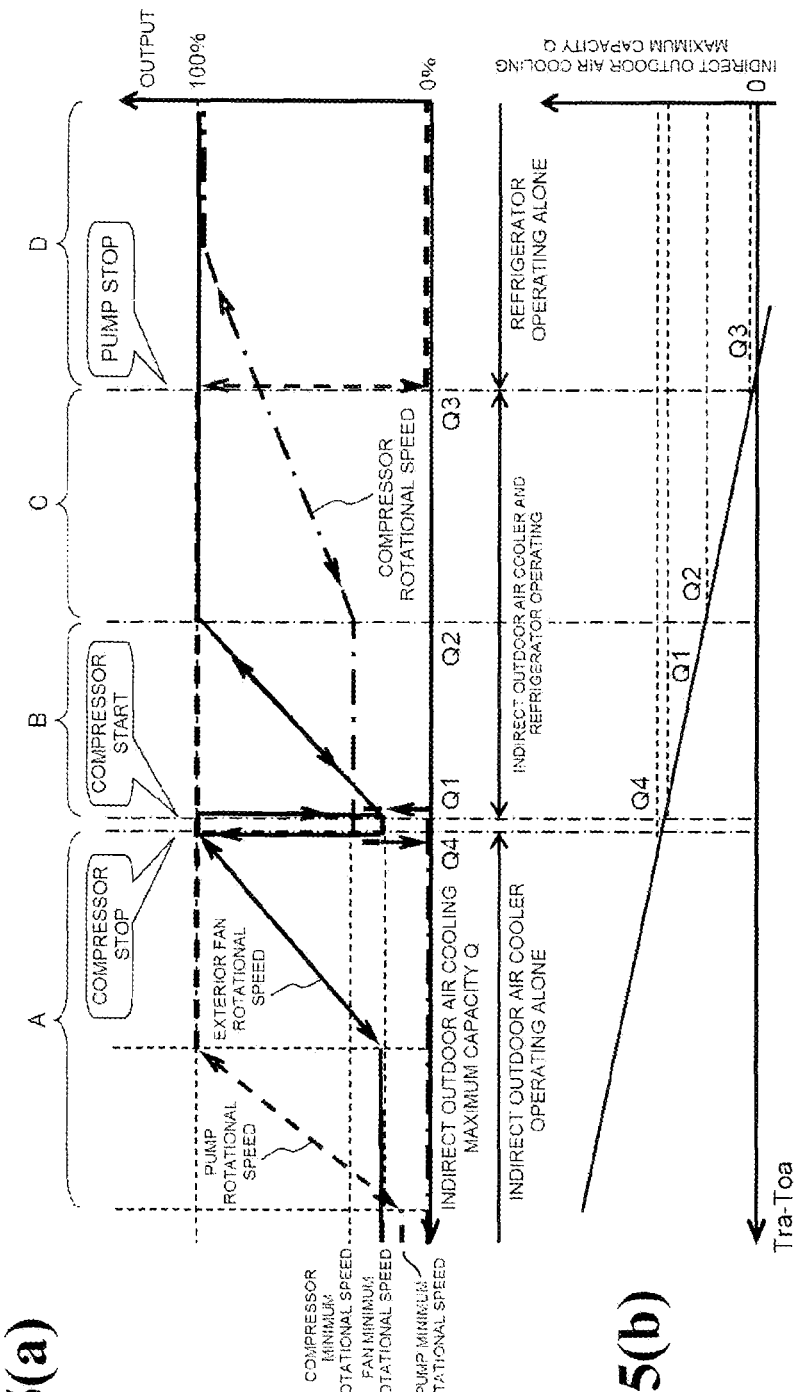
FIGS. 5(a) and 5(b) are diagrams illustrating, for instance, the operation states and maximum capacity for various structures in respective modes.

That is, the compressor 55 incurs the greatest power consumption, of very large magnitude, whereas the circulating pump 53 incurs the smallest power consumption. For instance, the operation example illustrated in FIG. 5(a) illustrates a substantially optimal operation method, from the viewpoint of energy saving effects, in accordance with such a relationship.

The above variables (for instance, Qi and Qreq; herein the threshold values Q1, Q2, Q4 may also be regarded as variables) and so forth are used to determine whether a mode change is to be performed or not. The conditions for such a determination vary depending on the current mode.

Specifically, in a case where, for instance, the current mode is in mode A, the condition for determining whether or not the mode is to be changed to mode B is as follows:

"Qreq>Q1?" (alternatively, "Qi<Q1?" is also possible, as explained below; the definition of Q1 differs between the case "Qreq>Q1?" and the case "Qi<Q1?").

If "QreqQ1" holds, then mode A is maintained. On the other hand, if "Qreq>Q1" holds, the mode is changed to mode B. Herein, preferably, the rotational speed of at least one from among the circulating pump 53 and the exterior fan (fan 71c) is set to the minimum rotational speed. The determination process is executed for instance periodically, but it is not limited to this example. The same applies also to other instances of mode change determination below.

If the current mode is in mode B, then two mode changes are possible, namely change to mode C and change to mode A, as described above.

The condition for determining firstly whether or not the mode is to be changed to mode A is as follows:

"Qreq<Q4?" (alternatively, "Qi>Q4?" is also possible, as explained below; the definition of Q4 differs between the case "Qreq<Q4?" and the case "Qi>Q4?").

If "QreqQ4" holds, then mode B is maintained. On the other hand, if "Qreq<Q4" holds, the mode is changed to mode A.

The condition for determining whether or not mode B is to be changed to mode C is as follows:

"Qi<Q2?".

If "Qi≥Q2" holds, then mode B is maintained. On the other hand, if "Qi<Q2" holds, the mode is changed to mode C.

If the current mode is in mode B, basically both "Qreq<Q4?" and "Qi<Q2?" are determined periodically.

If the current mode is in mode C, then two mode changes are possible, namely change to mode B and change to mode D, as described above.

The condition for determining firstly whether or not mode C is to be changed to mode B is as follows:

"Qi>Q2?".

If "Qi≥Q2" holds, then mode C is maintained. On the other hand, if "Qi>Q2" holds, the mode is changed to mode B.

The condition for determining whether or not mode C is to be changed to mode D is as follows:

"Qi<0?" (instance of an example of Q3=0).

If "Qi>0" holds, then mode C is maintained.

On the other hand, if "Qi<0" holds, the mode is changed to mode D. That is, in a case where the outdoor air temperature is higher than the indoor air (warm air) temperature, and accordingly the indirect outdoor air cooler does not function (zero or negative, i.e. the temperature of the indoor air rises contrariwise), the mode is shifted to mode D, to thereby stop the indirect outdoor air cooler and bring about individual operation of the general air conditioner.

Further, in a case where the current mode is in mode C, "0≤Qi≤Q2?" is determined firstly, and mode C is maintained if that condition is satisfied (i.e. if the current state is "0≤Qi≤Q2"). In this case, needless to say, the determination of the above "Qi>Q2?" and "Qi<0?" is performed in a case where the determination of "0≤Qi≤Q2?" yields NO.

In a case where the current mode is in mode D, the condition for whether or not the mode is to be changed to mode C is as follows:

"Qi>0?".

If "Qi≤0" holds, then mode D is maintained. On the other hand, if "Qi>0" holds, the mode is changed to mode C.

The method for determining mode changes is not limited to the above example. The method described below may be resorted to instead. Basically, it suffices that the temperature of the space to be cooled (herein, the server room) can be kept at substantially the set temperature; accordingly, adjustment and control need only be performed in such a manner that the temperature Tsa of cold air lies within a temperature range of set temperature±α (where α is an arbitrary margin, for instance about 0.5° C.)

Basically, adjustment and control are for instance performed in such a manner that, regardless of the mode, the cold air temperature Tsa lies within a range Tsaset±α (upper limit value Tsamax=Tsaset+α, lower limit value Tsamin=Tsaset−α), where Tsaset is the set temperature and Tsa is the measured cold air temperature.

Some restrictions apply, however, depending on the mode (for instance, general air conditioner not operating, or operating but at a fixed minimum capacity), and hence some instances may arise wherein the cold air temperature Tsa cannot lie within the temperature range of set temperature±α. A mode change suffices in such a case.

Mode A, for instance, involves individual operation of the indirect outdoor air cooler, and hence adjustment and control are basically performed in such a manner that the cold air temperature Tsa in the individual operation of the indirect outdoor air cooler lies within the above predefined temperature range (Tsaset±α; upper limit value Tsamax to lower limit value Tsamin). Depending on the circumstances (for instance, high outdoor air temperature), however, the cold air temperature Tsa may fail to lie, in some instances, within the above predefined temperature range, even if the indirect outdoor air cooler is operating at maximum capacity. Such instances may be coped with by operating both the indirect outdoor air cooler and the general air conditioner, through a mode change to mode B.

Accordingly, the determination for mode change and the mode change itself may be carried out for instance as follows.

In a case where, for instance, the current mode is in mode A, the condition for determining whether or not the mode is to be changed to mode B is as follows:

"Tsa>Tsamax?".

If "Tsa>Tsamax" holds, i.e. if the cold air temperature Tsa cannot be maintained within the predefined temperature range (if the upper limit value Tsamax is exceeded), even upon operation at maximum capacity in the individual operation of the indirect outdoor air cooler as described above, the mode is changed to mode B. Herein, preferably, the rotational speed of at least one from among the circulating pump 53 and the exterior fan (fan 71c) is set to the minimum rotational speed.

On the other hand, if "Tsa≤Tsamax" holds, i.e. if the cold air temperature Tsa can be maintained within the predefined temperature range (upper limit value Tsamax is not exceeded) in the individual operation of the indirect outdoor air cooler, then mode A is maintained.

If the current mode is in mode B, the condition for determining whether or not the mode is to be changed to mode C is identical to that of upon change from mode A to mode B (although the purport is different), namely as follows:

"Tsa>Tsamax?".

If "Tsa>Tsamax" holds, then the mode is changed to mode C. In mode B, as described above, the general air conditioner operates at all times at the minimum cooling capacity, and the cooling capacity of the indirect outdoor air cooler is adjusted and controlled. However, if the cold air temperature Tsa cannot be maintained within the predefined temperature range even upon operation of the indirect outdoor air cooler at maximum capacity (if the upper limit value Tsamax is exceeded; if cooling capacity is insufficient), then the mode is changed to mode C. That is, the restriction "general air conditioner operates at a minimum capacity" is lifted.

On the other hand, if "Tsa≤Tsamax" holds, i.e. if the cold air temperature Tsa can be maintained within a predefined temperature range even with the general air conditioner operating at minimum capacity, then mode B is maintained.

If the current mode is in mode B, it is further determined whether the mode is to be changed to mode A or not. The condition for this determination is for instance as follows:
"Tsa<Tsamin?"

If "Tsa<Tsamin" holds, then the mode is changed to mode A. In mode B, as described above, the indirect outdoor air cooler is adjusted and controlled, with the general air conditioner operating at minimum capacity. However, if the cold air temperature Tsa cannot be maintained within the predefined temperature range (if the cold air temperature Tsa is below the lower limit value Tsamin; if cooling capacity is excessive), even if the cooling capacity of the indirect outdoor air cooler is set to a minimum cooling capacity, the operation of the general air conditioner is paused (mode change to mode A).

On the other hand, if "Tsa≥Tsamin" holds, then mode B is maintained.

Upon initial determination, in mode B, of "Tsamin≤Tsa≤Tsamax", it may be determined not to perform a mode change if the foregoing condition is satisfied, or it may be determined to perform a mode change if the condition is not satisfied. If the mode is changed, it is then further determined, according to the above determination, to which mode from among mode A and mode C the mode is to be changed. The same is true in a case where the current mode is in mode C.

Mode change determination in a case where the current mode is in mode C is identical to that of mode B above.

In a case where the current mode is in mode C, specifically, the condition for determining whether or not the mode is to be changed to mode D is as follows:
"Tsa>Tsamax?"

If "Tsa>Tsamax" holds, then the mode is changed to mode D. In mode C, as described above, the indirect outdoor air cooler operates at maximum capacity, while the general air conditioner, although not particularly limited thereto, operates normally. As a result, a case where "Tsa>Tsamax" holds in mode C denotes that the cold air temperature Tsa cannot be maintained within the predefined temperature range (the upper limit value Tsamax is exceeded) even with both the general air conditioner and the indirect outdoor air cooler operating at maximum capacity.

An instance where the cold air temperature Tsa exceeds the upper limit value Tsamax is basically not envisageable, even upon operation at maximum capacity during individual operation of the general air conditioner. The above situation may be regarded as a situation where the temperature is contrariwise raised by the indirect outdoor air cooler, due to the outdoor air temperature being higher than the temperature of the indoor air (warm air). Accordingly, the mode is changed to mode D, which is a mode of individual operation of the general air conditioner.

If the current mode is in mode C, it is further determined whether the mode is to be changed to mode B or not. The condition for this determination is for instance as follows:
"Tsa<Tsamin?"

A case of "Tsa<Tsamin" in mode C signifies that the cold air temperature Tsa cannot be maintained within the predefined temperature range (the cold air temperature Tsa is below the lower limit value Tsamin) even if the cooling capacity of the general air conditioner is set to minimum, under a condition whereby the indirect outdoor air cooler is operating at maximum capacity at all times.

Accordingly, the above situation can be coped with by removing the condition "indirect outdoor air cooler operating at maximum capacity at all times" (the condition "general air conditioner is operated at minimum capacity at all times" will apply hereafter) i.e. by changing the mode to mode B.

If the current mode is in mode D, it is determined only whether the mode is to be changed to mode C or not. The condition for this determination is for instance as follows:
"Tsa<Tsamin?"

That is, if during individual operation of the general air conditioner the cold air temperature Tsa cannot be maintained within a predefined temperature range (cold air temperature Tsa is below the lower limit value Tsamin), even if the cooling capacity of the general air conditioner is set to minimum, the mode is changed to mode C.

Mode A may include a normal mode and an energy saving mode. In the normal mode, either the circulating pump 53 or the fan 71c is operated at maximum rotational speed. In the example illustrated in the figure, the circulating pump 53 is operated at maximum rotational speed, but not being limited to this example, the fan 71c may be operated instead at maximum rotational speed. In the energy saving mode, either the circulating pump 53 or the fan 71c is operated at minimum rotational speed. In the example illustrated in the figure, the fan 71c is operated at minimum rotational speed, but not being limited to this example, the circulating pump 53 may be operated instead at minimum rotational speed.

In this example, the mode is changed to the normal mode once "Tsa>Tsamax" holds, if the current mode is the energy saving mode in mode A. The mode is changed to the energy saving mode once "Tsa<Tsamin" holds, if the current mode is the normal mode in mode A. In this case, it is further determined whether or not the mode is to be changed to mode B, during the normal mode, although this determination is not required in the energy saving mode.

The control details in each operation mode, as well as the control involved in switching operation modes, have been explained above mainly with reference to FIG. 4.

In the present air conditioning system, as described above, a configuration is realized firstly wherein two cycles, namely an indirect outdoor air cooling cycle and a vapor compression type cooling cycle (refrigerator operation of the general air conditioner) can be operated together (combined operation). This configuration itself elicits various effects that differ from those in conventional instances. This has already been explained above, and will not be explained again herein.

As characterizing features of the method having the above features, for instance:

(1) a plurality of operation modes is provided, and one mode among them involves performing a combined operation of an indirect outdoor air cooler and a refrigerator (general air conditioner);

(2) operation mode switching is determined according to an indirect outdoor air cooling maximum capacity Q that is computed on the basis of the difference between outdoor air temperature and indoor air temperature;

(3) respective control methods for bringing a blow-out air temperature (cold air temperature Tsa) within a set temperature range (Tsamin≤Tsa≤Tsamax) are presented as appropriate control methods for each operation mode (as described above, or for instance as described below with reference to FIG. 5(*a*)).

By virtue of the above characterizing features, it becomes for instance possible to enhance cooling efficiency by, for example, maximally utilizing the indirect outdoor air cooling capacity, and by optimizing the control method for each operation scheme.

FIG. 5(a) illustrates one example of operation states in various configurations, according to the above control scheme.

Herein, the "pump rotational speed", the "exterior fan rotational speed" and the "compressor rotational speed" are expressed in the form of output from 0% to 100%. Obviously, output 0% denotes a stopped state, while output 100% denotes a maximum capacity operation state. The "pump rotational speed" is the rotational speed (output) of the circulating pump 53, the "exterior fan rotational speed" is the rotational speed (output) of the fan 71c, and the "compressor rotational speed" is the rotational speed (output) of the compressor 55.

As illustrated in FIG. 5(b), the indirect outdoor air cooling maximum capacity Q(Qi) increases leftwards, and decreases rightwards in the figure. In the region depicted on the left of the figure, the Q(Qi) value is high, and the required cooling capacity Qreq can be covered by the indirect outdoor air cooler alone. Therefore, the mode is in mode A above. In mode A, as a matter of course, the compressor 55 is stopped, and the "compressor rotational speed" is 0%.

In a region (region on the left within mode A, in the figure) where Q(Qi) value is comparatively high, in mode A illustrated in the figure, Tsa temperature control is performed (corresponding to the above energy saving mode) by operating with the "exterior fan rotational speed" at the minimum rotational speed, and by adjusting and controlling the "pump rotational speed". Herein, Tsa temperature control is control of maintaining the indoor air (cold air) temperature Tsa within a predefined temperature range based on a set value.

In a region (region on the right within mode A, in the figure) where the Q(Qi) value is comparatively low, in mode A illustrated in the figure, Tsa temperature control is performed (corresponding to the normal mode) by operating with the "pump rotational speed" at maximum rotational speed, and by adjusting and controlling the "exterior fan rotational speed".

In mode B, as described above, the "compressor rotational speed" is a fixed minimum rotational speed. Regarding the "pump rotational speed" and the "exterior fan rotational speed", Tsa temperature control is performed in the example of FIG. 5(a) by operating with the "pump rotational speed" at maximum rotational speed, and by adjusting and controlling the "exterior fan rotational speed". The circulating pump 53, which has comparatively low consumption, is preferably utilized to the maximum, from the viewpoint of the energy saving effect, as described above.

Not being limited to this example, the Tsa temperature may be controlled, for instance, by operating with the "exterior fan rotational speed" at a maximum rotational speed (setting the air volume by the fan to maximum), and by adjusting and controlling the "pump rotational speed".

The operation in mode C involves both the "pump rotational speed" and the "exterior fan rotational speed" at maximum rotational speed at all times. That is, the indirect outdoor air cooler is operated at maximum capacity at all times. The operation in mode C, therefore, is carried out at all times in such a manner that "cooling capacity supplied by the indirect outdoor air cooler=indirect outdoor air cooling maximum capacity Q(Qi)". Tsa temperature control is performed thereupon by adjusting and controlling the "compressor rotational speed".

In mode D, the indirect outdoor air cooler is in a stopped state; therefore, the "pump rotational speed" is 0% (circulating pump 53 stopped). The fan 71c however does not stop, for the reasons given above. In the example illustrated in the figure, the "exterior fan rotational speed" is 100% at all times, but the structure is not limited to this example. In mode D, in any case, Tsa temperature control is performed through adjustment and control of the "compressor rotational speed", once the indirect outdoor air cooler has been brought to a stopped state.

The minimum rotational speeds of the circulating pump 53, the fan 71c, and the compressor 55 at the time of operation are all determined (in that the rotational speeds cannot be lowered any further). No numerical values of rotational speed are given herein, since the values differ for each of the devices (products), as indicated above.

If the required cooling capacity Qreq is assumed to be fixed, then the indoor air (warm air) temperature Tra is likewise fixed. In this case, the value of the indirect outdoor air cooling maximum capacity Q(Qi) is determined by the outdoor air temperature. Further, mode changes are determined by the Q(Qi) value.

Under this assumption, an instance can be envisaged wherein the outdoor air temperature Toa rises gradually starting from a state on the left end of the left-side region within the region of mode A, i.e. from a state where the "compressor rotational speed" is 0% and the "pump rotational speed" and the "exterior fan rotational speed" are both minimum rotational speeds. In this case, the value of Qi decreases gradually according to the above calculation expression Qi (for instance, as illustrated in FIG. 5(b) and so forth).

In a case where the Qi value is sufficiently higher than the required cooling capacity Qreq, as illustrated for instance at the left end of the figure in FIG. 7(a), in a state of operation in mode A, then the indirect outdoor air cooler need naturally not operate at maximum, and for instance, the required cooling capacity Qreq can be covered even with both the "pump rotational speed" and the "exterior fan rotational speed" set to the minimum rotational speed, as described above. In a case however where the Qi value decreases gradually, as described above, this decrease can be responded to firstly, for instance, through an increase of the "pump rotational speed", as illustrated in FIG. 5(a). Once the "pump rotational speed" reaches a maximum value (output 100%), the "exterior fan rotational speed" is then raised, to respond thereby to the decrease in Qi value.

Basically (in a case where the above two value types Q1, Q4 are not used as threshold values), once the Qi value becomes smaller than the required cooling capacity Qreq (Qi<Qreq), the required cooling capacity Qreq cannot be covered even if the indirect outdoor air cooler is operated at maximum (even if both the "pump rotational speed" and the "exterior fan rotational speed" are set to a maximum value (output 100%)). That is, the indirect outdoor air cooler can no longer meet by itself the demand placed thereon. Accordingly, the mode is changed to mode B. That is, the state is changed to a combined operation state of the indirect outdoor air cooler and the general air conditioner (refrigerator). As described above, mode B involves a restriction in that the "compressor rotational speed" is set to a fixed minimum rotational speed.

Two types of threshold value, namely Q1 and Q4 are used in the examples described above, but instances of frequent mode changes between mode A and mode B may arise herein if Qi fluctuates around Qreq. Frequent start and stop of the compressor are likely to give rise to mechanical problems and to constitute a cause of malfunction and the like. Hence, time limits are ordinarily imposed. In order to avoid such situations, the threshold values for determination based on −c and +c above are set to be dissimilar between an instance of mode A→mode B and an instance of mode B→mode A.

The output at the "pump rotational speed" or the "exterior fan rotational speed" is reduced (rotational speed reduction) when changing the mode from mode A to mode B. In the example illustrated in FIG. 5(a), only the output at the "exterior fan rotational speed" is reduced (setting of minimum rotational speed; air volume by the fan set to minimum), while the "pump rotational speed" maintains the maximum rotational speed, but the configuration is not being limited to this example. A reverse configuration is also possible wherein the output at the "pump rotational speed" alone is reduced, and the "exterior fan rotational speed" is maintained at the maximum rotational speed. Alternatively, the output at both the "pump rotational speed" and the "exterior fan rotational speed" may be reduced (reduction of rotational speed reduction, but not to minimum rotational speed).

In the example of FIG. 5(a), the output at the "exterior fan rotational speed" is reduced down to that of the minimum rotational speed, but the output is not being limited to this example. For instance, the output may be reduced down to a predefined rotational speed set beforehand. This is identical to an instance where the output at the "pump rotational speed" is reduced.

In the above example, mode B is maintained as long as the required cooling capacity Qreq can be covered by the indirect outdoor air cooler and the general air conditioner (at minimum capacity), even if the outdoor air temperature Toa increases gradually in mode B. Basically, the required cooling capacity Qreq can be covered through adjustment and control of the "exterior fan rotational speed", if a state holds where Qi≥Q2. Once a state Qi<Q2 is brought about, however, the required cooling capacity Qreq can no longer be covered even if the "exterior fan rotational speed" as well is set to the maximum rotational speed (i.e. even if the indirect outdoor air cooler operates at maximum).

Accordingly, once the state Qi<Q2 is brought about, the restriction to the effect of "setting the 'compressor rotational speed' to a fixed minimum rotational speed" is removed for instance through changing of the mode to mode C, as illustrated in FIG. 5(a). In mode C, as a result, the gradual increase of the outdoor air temperature Toa can be responded to through a gradual increase in the "compressor rotational speed", as illustrated in the figure. In mode C the indirect outdoor air cooler operates at maximum at all times, as illustrated in the figure.

In a case where, for instance, Toa>Tra holds as a result of a further rise in the outdoor air temperature Toa, the operation of the indirect outdoor air cooler is no longer meaningful (the temperature of the indoor air rises contrariwise), and hence the mode is changed over to mode D. That is, the operation of the indirect outdoor air cooler is discontinued, and the refrigerator (general air conditioner) is set to operate alone.

In the example illustrated in FIG. 5(a), the indirect outdoor air cooler is operating at the maximum cooling capacity Qi upon (immediately before) a mode change from mode A to mode B, upon (immediately before) a mode change from mode B to mode C, upon (immediately before) a mode change from mode C to mode B, and upon (immediately before) a mode change from mode C to mode D.

In the mode changes illustrated in FIG. 4 and FIG. 5(a), basically, mode changes from the left towards the right in the figure can be regarded as "mode changes towards no energy saving", whereas mode changes from the right towards the left in the figure can be regarded as "mode changes towards energy saving".

FIG. 5(b) illustrates the relationship between the temperature difference "Tra−Toa" of the outdoor air and indoor air (warm air) and the indirect outdoor air cooling maximum capacity Q(Qi), as well as mode changes corresponding to the various threshold values.

In FIG. 5(b), the abscissa axis represents the temperature difference "Tra−Toa" and the ordinate axis represents the indirect outdoor air cooling maximum capacity Q(Qi). The abscissa axis may be set to represent, instead, the outdoor air temperature Toa in a case where Tra is set to be fixed. The value of the temperature difference "Tra-Toa" increases towards the left in the figure.

As illustrated in FIG. 5(b) (and as described above), the indirect outdoor air cooling maximum capacity Q(Qi) increases as the temperature difference "Tra−Toa" between outdoor air and indoor air (warm air) becomes greater.

In an assumption that runs contrary to that in the explanation of FIG. 5(a), the temperature difference "Tra−Toa" may be assumed to increase gradually from the state in mode D. In mode D, the indirect outdoor air cooling maximum capacity Q(Qi) takes on for instance a negative value. That is, the indirect outdoor air cooler is in a state of having substantially no cooling function of the indoor air (if the indirect outdoor air cooler were operating, the latter would have, on the contrary, a heating function). Accordingly, the indirect outdoor air cooler is brought to a stopped state.

The mode is changed to mode C when, in this state, the Qi value exceeds the threshold value Q3 (in the example of FIG. 4 and so forth, Q3=0 holds, but it is not being limited to this example), as the Qi value increases as illustrated in the figure, through gradual increase of the temperature difference "Tra−Toa", as described above.

In mode C as well, the mode is changed to mode B in a case where the Qi value exceeds the threshold value Q2 as the Qi value increases in the way illustrated in the figure, through gradual increase of the temperature difference "Tra−Toa".

In mode B as well, the mode is changed to mode A if, for instance, "Q4>Qreq" holds (in the present example, Q4=Qi−c) or if "Qi>Q4" holds (in the present example, Q4=Qreq+c), as the Qi value increases in the way illustrated in the figure, through gradual increase of the temperature difference "Tra−Toa".

In mode A, the mode is changed to mode B if, for instance "Q1<Qreq" holds (in the present example, Q1=Qi+c) or if "Qi<Q1" holds (in the present example, Q1=Qreq−c), as the Qi value decreases.

In any case, basically, mode A (individual operation of the indirect outdoor air cooler) is set if the indirect outdoor air cooling maximum capacity Q(Qi) is equal to or higher than the required cooling capacity Qreq; herein the definition of Q1, Q4 above is not particularly important.

Figure 6:
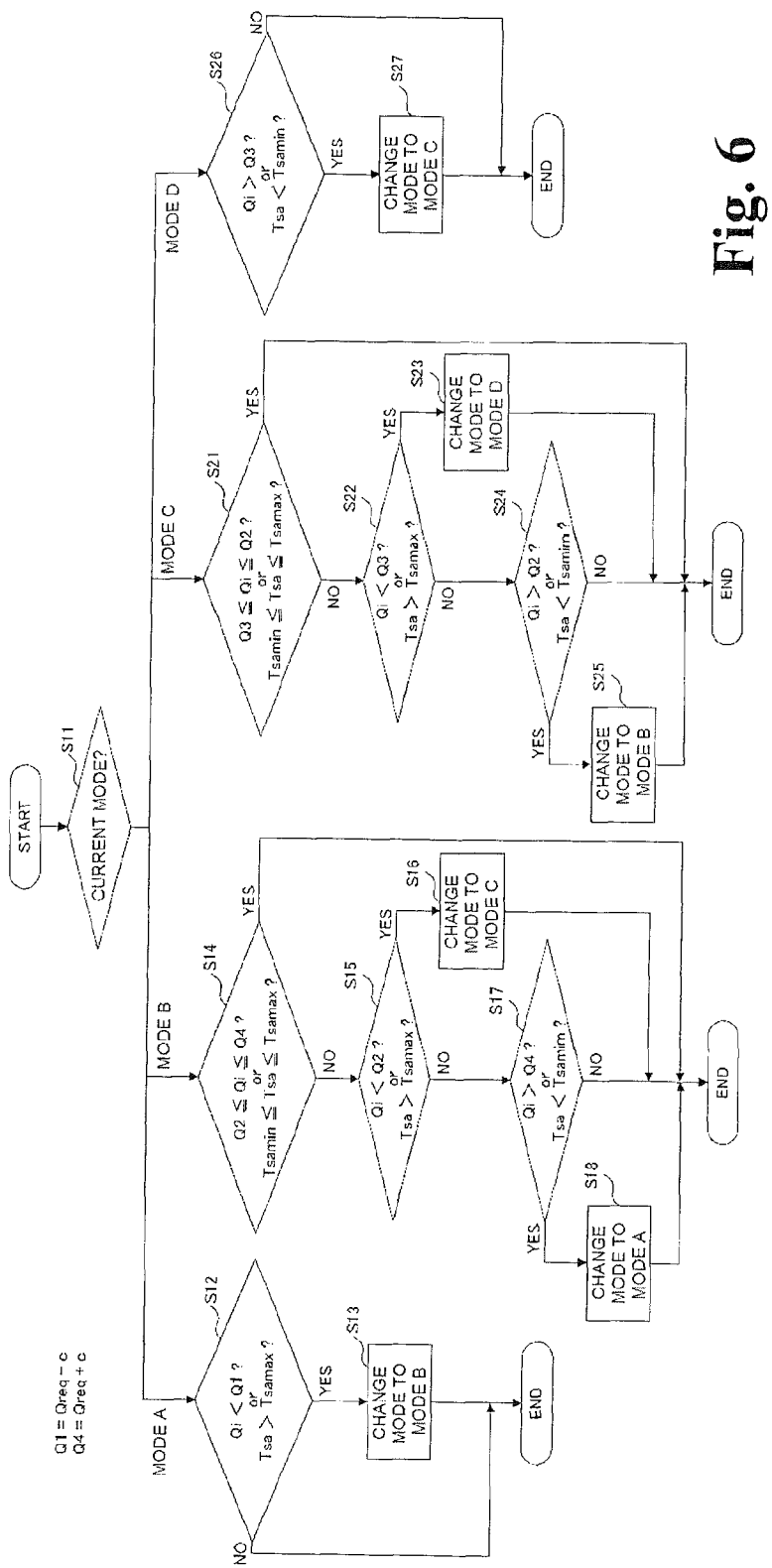
FIG. 6 is a flowchart diagram of a mode change process.

FIG. 6 illustrates a flowchart diagram of a mode change process according to the other definition (specifically, for instance, Q1=Qreq−c and Q4=Qreq+c).

The process of FIG. 6 is performed, for instance, at predefined periods. Alternatively, for instance, the process of FIG. 6 may be performed manually at arbitrary timings.

The current mode is determined first (step S11). For instance, it suffices that "current mode" be stored and be referred to. The stored content of "current mode" is updated whenever the mode is changed.

A process according to the current mode is executed as illustrated in the figure.

Firstly, if the current mode is in mode A, it is determined, for instance, whether "Qi<Q1" holds or not (in the present example, Q1=Qreq−c) (step S12). If "Qi≥Q1" holds (NO in step S12), the process is terminated as it is, with no mode change. On the other hand, if "Qi<Q1" holds, the mode is changed to mode B (step S13), and the present process is terminated.

Alternatively, the process is not limited to this process example, and a determination process of mode change may be performed, on the basis of a predefined range (upper limit value, lower limit value and so forth) based on the cold air temperature Tsa and set temperature, as already explained above. In the case of this example, the determination of step S12 may be set to, for instance, "Tsa>Tsamax" or the like. In the case of this example, the process is terminated as it is if "Tsa≥Tsamax" holds (NO in step S12). On the other hand, if "Tsa>Tsamax" holds (YES in step S12), the mode is changed to mode B (step S13), and the present process is terminated.

If the current mode is in mode B, it is firstly determined, for instance, whether "Q2≤Qi≤Q4" holds or not (step S14). If "Q2≤Qi≤Q4" holds (YES in step S14), the process is terminated as it is, with no mode change. If "Q2≤Qi≤Q4" does not hold (NO in step S14), then either "Q2>Qi" or "Qi>Q4" holds. In the present example there holds Q4=Qreg+c.

In the example illustrated in the figure, accordingly, it is determined firstly, for instance, whether "Qi<Q2" holds or not (step S15). If "Qi<Q2" holds (YES in step S15), the mode is changed to mode C (step S16).

On the other hand, if "Qi<Q2" does not hold (NO in step S15), then "Qi>Q4" should hold, but in the example illustrated in the figure it is determined whether "Qi>Q4" holds or not, for confirmation (step S17). If "Qi>Q4" holds (YES in step S17), the mode is changed to mode A (step S18). On the other hand, if "Qi≤Q4" holds (NO in step S17), the present process is terminated as it is, without execution of the process of step S18.

Alternatively, the process is not limited to this process example, and a determination process of mode change may be performed, on the basis of a predefined range (upper limit value, lower limit value and so forth) based on the cold air temperature Tsa and set temperature, as already explained above. In the case of this example, the determination of step S14 may be set to, for instance, "Tsamin≤Tsa≤Tsamax" or the like. If "Tsamin≤Tsa≤Tsamax" holds (YES in step S14), i.e. if the cold air temperature Tsa lies within a predefined range based on the set temperature, the process is terminated as it is, with no mode change.

On the other hand, if "Tsamin≤Tsa≤Tsamax" does not hold (NO, step S14), then either "Tsamin>Tsa" or "Tsa>Tsamax" holds.

In the example illustrated in the figure, accordingly, it is determined firstly, for instance, whether "Tsa>Tsamax" holds or not (step S15). If "Tsa>Tsamax" holds (YES in step S15), the mode is changed to mode C (step S16).

On the other hand, if "Tsa>Tsamax" does not hold (NO in step S15), then "Tsamin>Tsa" should hold, but in the example illustrated in the figure it is determined whether "Tsamin>Tsa" holds or not, for confirmation (step S17). If "Tsamin>Tsa" holds (YES in step S17), the mode is changed to mode A (step S18).

If the current mode is in mode C, it is firstly determined, for instance, whether "Q3≤Qi≤Q2" holds or not (step S21). If "Q3≤Qi≤Q2" holds (YES in step S21), the process is terminated as it is, with no mode change. If "Q3≤Qi≤Q2" does not hold (NO in step S21), then either "Qi>Q2" or "Qi<Q3" holds. Herein, for instance, Q3=0, but it is not being limited to this example. Preferably, Q3 is set to '0' or an arbitrary value around '0'.

In the example illustrated in the figure, accordingly, it is determined firstly, for instance, whether "Qi<Q3" holds or not (step S22). If "Qi<Q3" holds (YES in step S22), the mode is changed to mode D (step S23).

On the other hand, if "Qi<Q3" does not hold (NO in step S22), then "Qi>Q2" should hold, but in the example illustrated in the figure it is determined whether "Qi>Q2" holds or not, for confirmation (step S24). If "Qi>Q2" holds (YES in step S24), the mode is changed to mode B (step S25). On the other hand, if "Qi≤Q2" holds (NO in step S24), the present process is terminated as it is, without execution of the process of step S25.

Alternatively, the process is not limited to this process example, and a determination process of mode change may be performed, on the basis of a predefined range (upper limit value, lower limit value and so forth) based on the cold air temperature Tsa and set temperature, as already explained above. In the case of this example, the determination of step S21 may be set to, for instance, "Tsamin≤Tsa≤Tsamax" or the like. If "Tsamin≤Tsa≤Tsamax" holds (YES in step S21), i.e. if the cold air temperature Tsa lies within a predefined range based on the set temperature, the process is terminated as it is, with no mode change.

On the other hand, if "Tsamin≤Tsa≤Tsamax" does not hold (NO, step S21), then either "Tsamin>Tsa" or "Tsa>Tsamax" holds.

In the example illustrated in the figure, accordingly, it is determined firstly, for instance, whether "Tsa>Tsamax" holds or not (step S22). If "Tsa>Tsamax" holds (YES in step S22), the mode is changed to mode D (step S23).

On the other hand, if "Tsa>Tsamax" does not hold (NO in step S22), then "Tsamin>Tsa" should hold, but in the example illustrated in the figure it is determined whether "Tsamin>Tsa" holds or not, for confirmation (step S24). If "Tsamin>Tsa" holds (YES in step S24), the mode is changed to mode B (step S25).

If the current mode is in mode D, it is determined, for instance, whether "Qi>Q3" holds or not (step S26). If "Qi≤Q3" holds (NO in step S26), the process is terminated as it is, with no mode change. On the other hand, if "Qi>Q3" holds, the mode is changed to mode C (step S27), and the present process is terminated.

The process is not limited to this process example, and, alternatively, a determination process of mode change may be performed, on the basis of a predefined range (upper limit value, lower limit value and so forth) based on the cold air temperature Tsa and set temperature, as already explained above. In the case of this example, the determination of step S26 may be set to, for instance, "Tsa<Tsamin?" or the like. In the case of this example, the process is terminated as it is if "Tsa≥Tsamin" holds (NO in step S26). On the other hand, if "Tsa<Tsamin" holds (YES in step S26), the mode is changed to mode C (step S27), and the present process is terminated.

It is possible to use only one method, or both methods concomitantly, from among a mode determination method that utilizes Qi and the threshold values (Q1, Q2, Q3, Q4) illustrated in FIG. 6, and a mode determination method that utilizes a predefined range (for instance, upper limit value Tsamax, lower limit value Tsamin) that is based on the cold air temperature Tsa and the set temperature. In a case where both methods are used concomitantly, for instance the determination in step S12 yields a mode change to mode B in step S13 if either "Qi<Q1" or "Tsa>Tsamax" holds. This applies in substantially the same way to other determinations, and will not be explained recurrently.

The effects of the control schemes above will be explained next by comparing FIGS. 7(a)-(c) and FIGS. 8(a)-8(c).

Figure 8A:
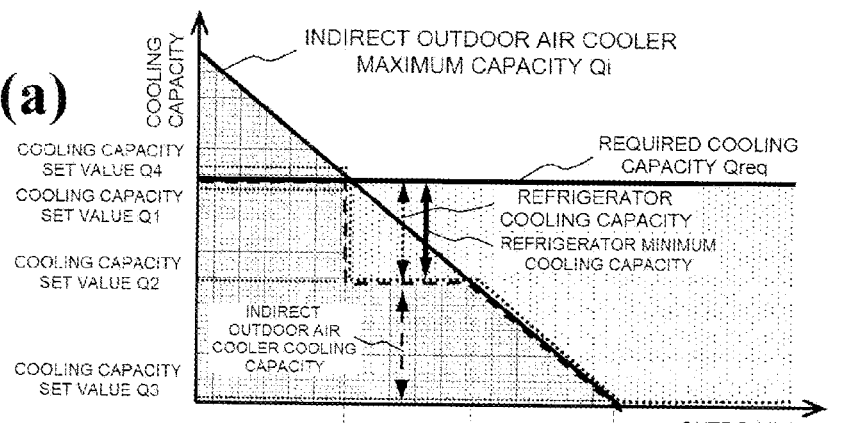
FIGS. 8(a) to 8(c) are diagrams illustrating operation states, power consumption and COP according to outdoor air temperature, in the case of the present method.
Figure 8B:
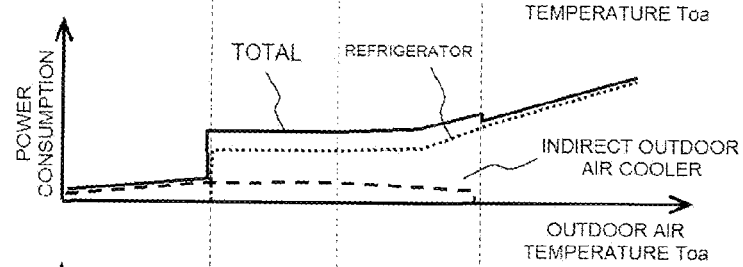
Figure 8C:
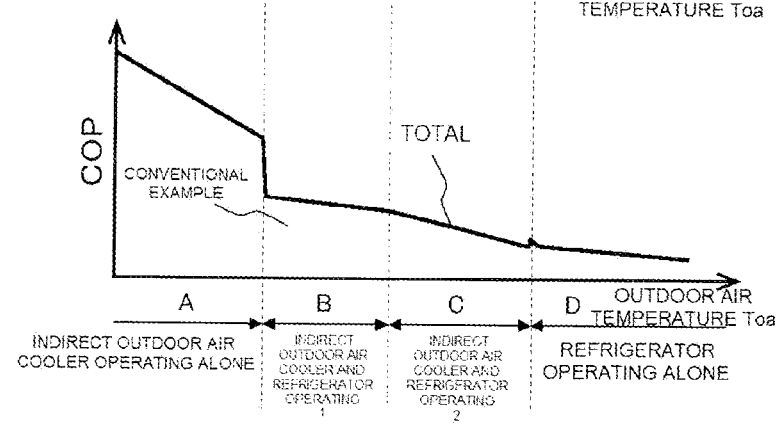

FIGS. 7(a)-7(c) illustrate an instance where a conventional method is resorted to, while FIGS. 8(a)-8(c) illustrate an instance of the present method.

In all of FIGS. 7(a), 7(b), 7(c) and in FIGS. 8(a), 8(b), 8(c), the abscissa axis represents the outdoor air temperature Toa. FIG. 7(a) and FIG. 8(a) illustrate a relationship between the outdoor air temperature Toa and the indirect outdoor air cooling maximum capacity Q(Qi). FIGS. 7(b) and 7(c) illustrate power consumption and COP corresponding to FIG. 7(a). FIGS. 8(b) and 8(c) illustrate power consumption and COP corresponding to FIG. 8(a). Herein, COP denotes a coefficient of performance, the explanation of which is omitted here.

In a case firstly where a conventional method is used, the indirect outdoor air cooler is set to individual operation if a state holds where the indirect outdoor air cooling maximum capacity Q(Qi) is equal to or higher than the required cooling capacity Qreq, as illustrated in FIG. 7(a). Once Qi becomes smaller than Qreq, the operation is switched to individual operation of the general air conditioner (refrigerator). Control is set to "switching from the indirect outdoor air cooler to the general air conditioner", such as the one above, on the basis of a technical concept in conventional art, for instance "switching from the compressor to the refrigerant pump", such as the one illustrated for instance in Patent document 1.

As is well known, the power consumption of the indirect outdoor air cooler may be much smaller (which entails higher COP) than that of the general air conditioner (refrigeration cycle). Accordingly, as illustrated in FIGS. 7(b), 7(c), power consumption during individual operation in the indirect outdoor air cooler is small, and COP is accordingly high, whereas power consumption during individual operation of the general air conditioner is large, and COP is accordingly low.

As illustrated in FIGS. 7(a), 7(b), 7(c), if a conventional method is resorted to, a state holds wherein individual operation of the general air conditioner is set despite the fact the cooling capacity of the indirect outdoor air cooler can be used; the indirect outdoor air cooler, the power consumption whereof is small, is thus not utilized efficiently to the full. The overall power consumption is as a result large, and COP is accordingly low.

In the above control scheme of the present method, by contrast, the indirect outdoor air cooler is set to individual operation if a state holds wherein the indirect outdoor air cooling maximum capacity Q(Qi) is equal to or higher than the required cooling capacity Qreq (herein, Q1 and Q4 above will not be considered), for instance as illustrated in FIG. 8(a). Regarding this feature, the present method may be regarded as substantially identical to the above conventional method.

On the other hand, once Qi becomes smaller than Qreq, the operation is not switched immediately to individual operation of the general air conditioner; instead, a combined operation of the general air conditioner and the indirect outdoor air cooler is performed so long as a state holds wherein the cooling capacity of the indirect outdoor air cooler can be used.

As a result, power consumption and COP may exhibit no change, with respect to those in the conventional method above, during the individual operation of the indirect outdoor air cooler (mode A) and during the individual operation of the general air conditioner (mode D), as illustrated in FIGS. 8(b), 8(c). However, power consumption and COP are better than those of the conventional method, during a combined operation of the general air conditioner and the indirect outdoor air cooler (mode B, mode C). In mode B and mode C, specifically, power consumption may be smaller than conventional power consumption, whereby COP (efficiency) is higher than that in conventional instances.

In mode B, the indirect outdoor air cooler cannot be operated at the maximum capacity Qi thereof, due to Qr above (refrigerator minimum capacity), as illustrated in FIG. 8(a). In the present method as well, the indirect outdoor air cooler cannot be utilized at 100%, but can be maximally utilized as much as possible.

As indicated above, the configuration of the integrated air conditioning system of the present example is not limited to the configurations of FIG. 1 and FIG. 2, and may adopt the configuration of FIG. 3 or FIG. 9, or some other configuration. The configuration of the air conditioning system to be controlled in accordance with the present method is not limited to an integrated air conditioning system.

FIG. 10 to FIG. 13 illustrate specific examples of other configurations of the air conditioning system of the present example.

FIG. 10 to FIG. 13 illustrate other configuration examples (I), (II), (III) (IV) of the air conditioning system of the present example.

As in the case of FIG. 3 and FIG. 9 above, structures in FIG. 10 to FIG. 13 that are substantially identical to those illustrated in FIG. 1 and FIG. 2 will be denoted by identical reference symbols, and an explanation thereof will be omitted or simplified.

Figure 10:
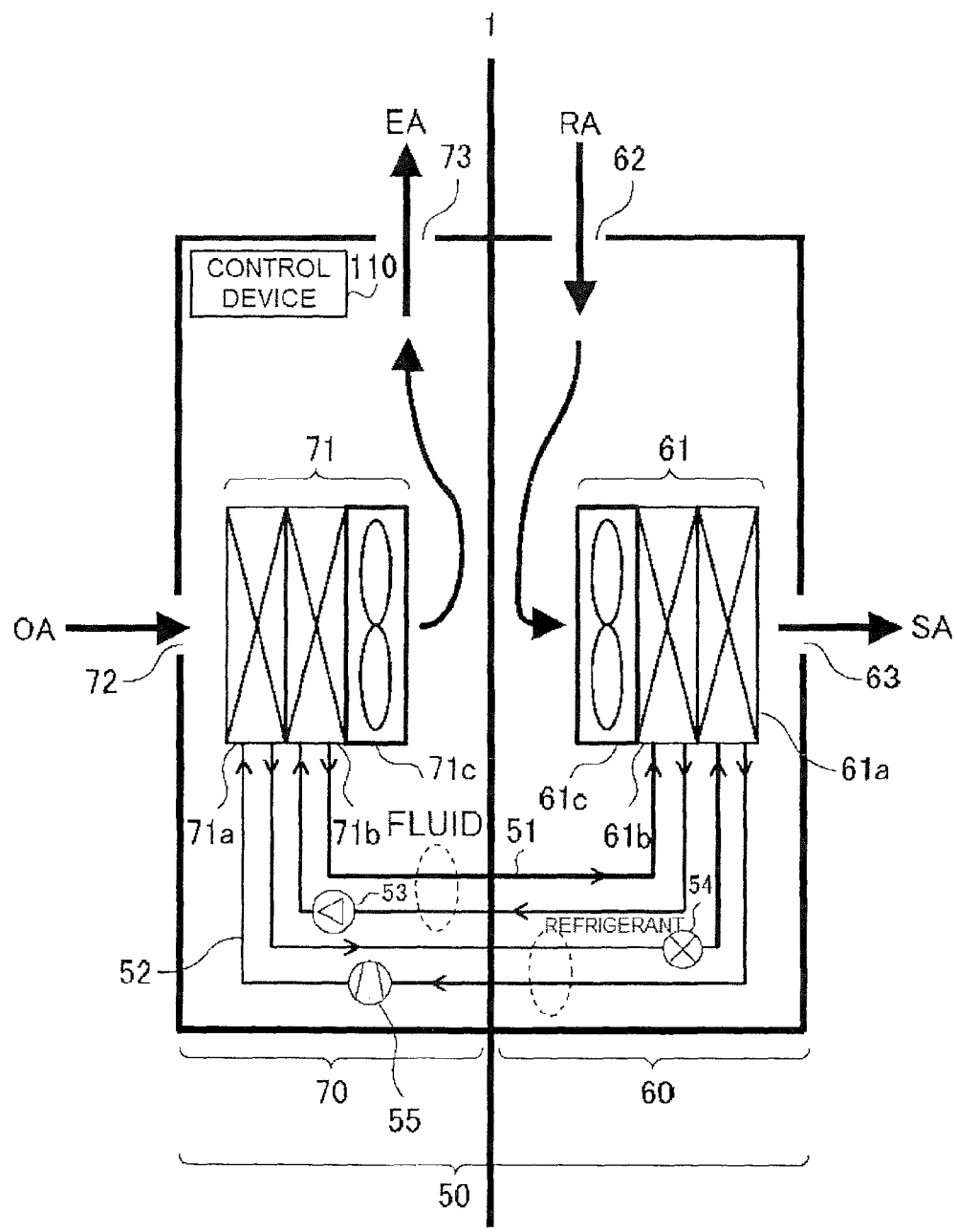
FIG. 10 is another configuration example (I) of an air conditioning system of the present example.

Firstly, FIG. 10 illustrates the configuration example of FIG. 9, but depicting those structures (piping, pumps and so forth) that are omitted in FIG. 9. Basically, the configuration in FIG. 10 is substantially identical to that of FIG. 1 and FIG. 2. Accordingly, FIG. 10 will not be explained further. In the example illustrated in the figure, the control device 110 is provided inside the outdoor air unit 70, but the structure is not being limited to this example. The control device 110 may be provided inside the indoor air unit 60, or may be provided at any other position.

The signal lines that connect the control device 110 with various control targets are omitted in FIG. 10. This is also the case in FIG. 11 to FIG. 13.

Figure 11:
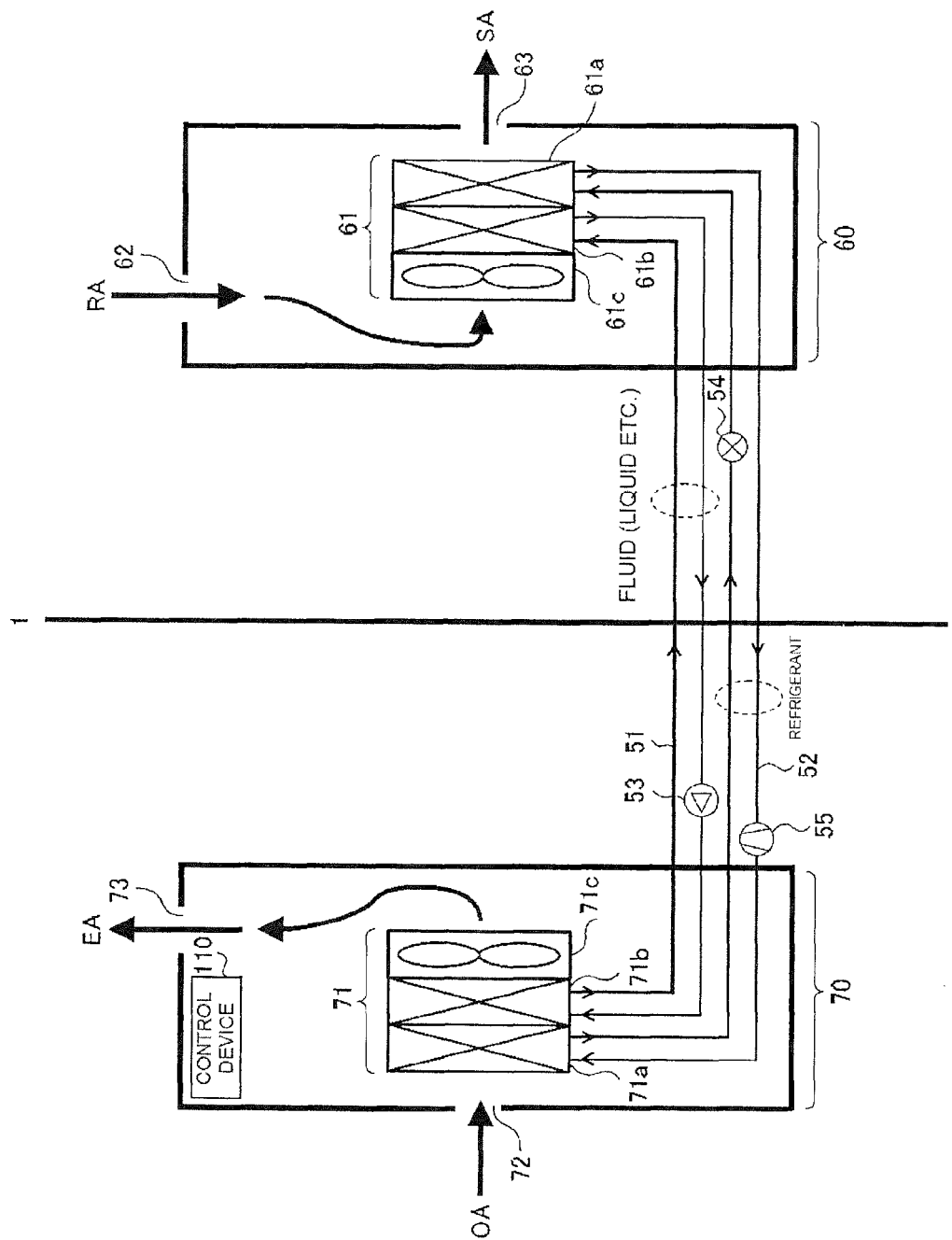
FIG. 11 is another configuration example (II) of the air conditioning system of the present example.
Figure 12:
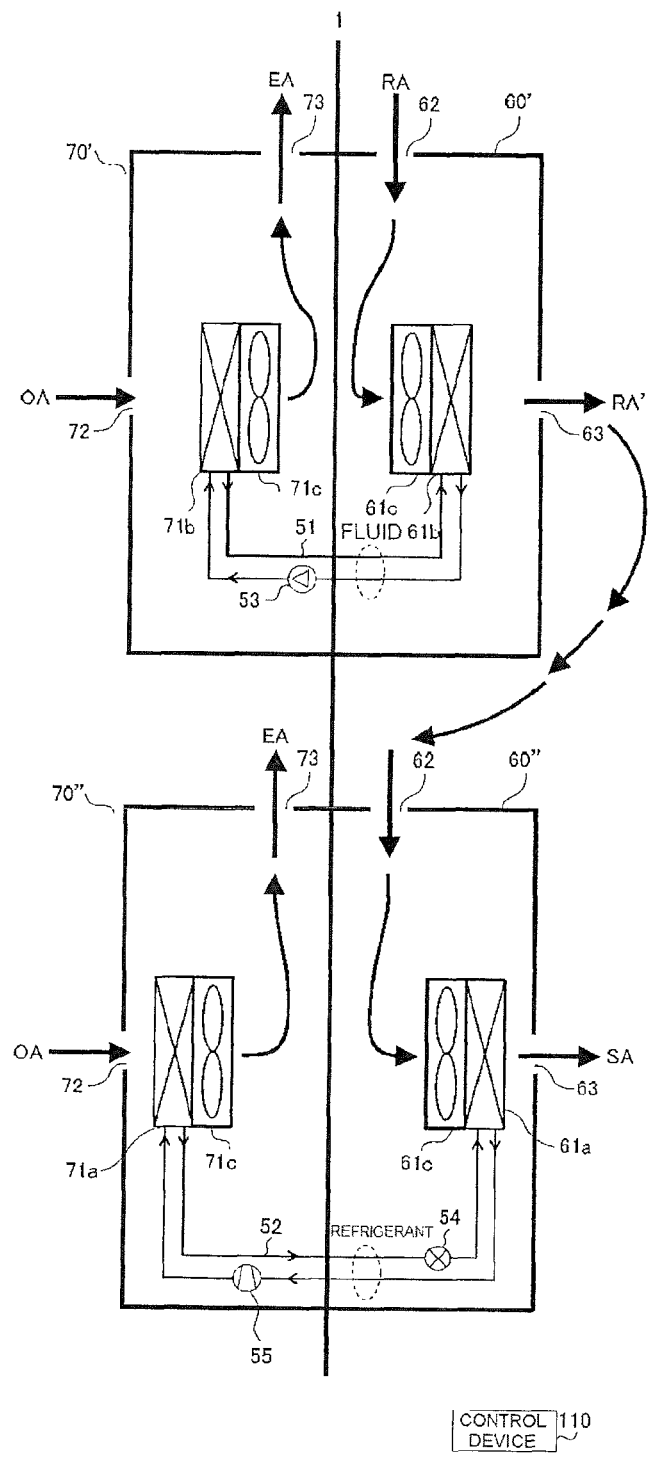
FIG. 12 is another configuration example (III) of the air conditioning system of the present example.
Figure 13:
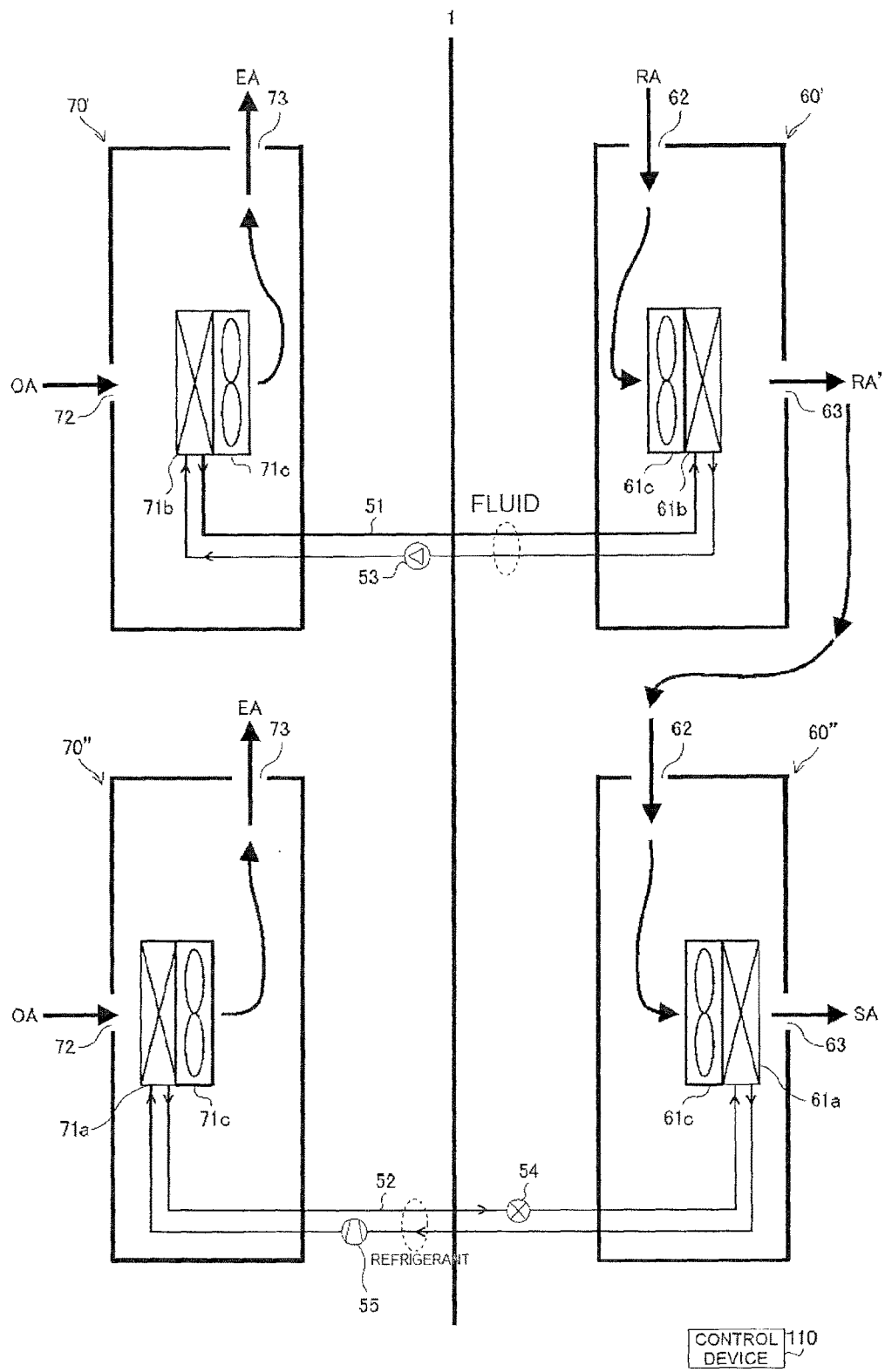
FIG. 13 is another configuration example (IV) of the air conditioning system of the present example.

In FIG. 11 to FIG. 13 explained below, the positions of the indoor air inlet 62, the indoor air outlet 63, the outdoor air intake port 72, and the outdoor air outlet 73, as well as the positions of the stacks 61, 71 (or some of the constituent elements thereof) are depicted according to the example illustrated in FIG. 9. However, these positions are illustrative, and are not limited to those in this example.

FIG. 11 illustrates another configuration example (II) of the air conditioning system of the present example.

In the examples of FIG. 1, FIG. 2, FIG. 3, FIG. 9 and FIG. 10, the indoor air unit 60 and the outdoor air unit 70 are disposed in such a way so as to close contact the wall 1. In particular, the foregoing are disposed to be as close to each other as possible. Such an arrangement is advantageous in that the length of each piping, such as the piping 51 and so forth, may be shorter, and hence such an arrangement may be regarded as one example of a preferred arrangement, although the arrangement is not limited to this example.

Depending on the circumstances in the actual site, the arrangement as in FIG. 1 and so forth may in some instances be difficult to realize. In other instances, the arrangement as in FIG. 1 and so forth may be undesirable for a number of reasons.

In another configuration example (II), accordingly, the indoor air unit 60 and the outdoor air unit 70 are for instance installed at positions spaced apart from the wall 1, for instance as illustrated in FIG. 11. Not being limited to this example, although not shown in the figure, one from among the indoor air unit 60 and the outdoor air unit 70 may be installed at a position spaced apart from the wall 1 as illustrated in FIG. 11, and the other be installed to close contact with the wall 1, as illustrated in FIG. 1 and so forth.

In FIG. 1 and so forth, those faces of the housings of the indoor air unit 60 and the outdoor air unit 70 that are close contacting the wall 1 are open, but in the case of FIG. 11, the faces of the housings are preferably configured to be not open.

In the configurations of FIG. 1 and so forth, the circulating pump 53, the expansion valve 54 and the compressor 55 are provided inside the indoor air unit 60 or the outdoor air unit 70. In the other configuration example (II), the circulating pump 53, the expansion valve 54, and the compressor 55 may be for instance provided outside the indoor air unit 60 and the outdoor air unit 70, as illustrated in FIG. 11. Although not shown in the figure, in the other configuration example (II) as well, the circulating pump 53, the expansion valve 54, and the compressor 55 may be provided inside the indoor air unit 60 or the outdoor air unit 70.

In FIG. 11 as well, the control device 110 may be provided inside the outdoor air unit 70, but the example is not limited to this. The control device 110 may be provided inside the indoor air unit 60, or may be provided at any other position.

In the above-described examples, the control target of the control device 110 was in all instances an integrated air conditioning system, such as those illustrated in FIG. 1, FIG. 2, FIG. 3, FIG. 9, FIG. 10 and FIG. 11. Specifically, the control target of the control device 110 was a configuration resulting from integrating together a configuration as an indirect outdoor air cooler and a configuration as a general air conditioner (refrigerator). However, the control target of the control device 110 is not limited to such an integrated air conditioning system. For instance, a structure such as the one illustrated in FIG. 12 or FIG. 13 (referred to as scattered configuration, as opposed to integrated configuration) may be the control target of the control device 110.

The configurations of FIG. 12 and FIG. 13 are made up, in both instances, of two indoor air units (notated as first indoor air unit 60' and second indoor air unit 60") and two outdoor air units (notated as first outdoor air unit 70' and second outdoor air unit 70").

FIG. 12 and FIG. 13 differ from each other in that in FIG. 12, all units are disposed to close contact to the wall 1, as in FIG. 1 and so forth, whereas in FIG. 13, for instance, all units are disposed spaced apart from the wall 1, as in FIG. 11. Except for the above difference, FIG. 12 and FIG. 13 are substantially identical, and will hereafter be explained collectively, without distinguishing between the two.

In the configurations of FIG. 12 and FIG. 13 (hereafter notated as FIG. 12 and so forth), the two indoor air units (first indoor air unit 60' and second indoor air unit 60") are provided on the "interior side" (inside the building). The two outdoor air units (first outdoor air unit 70' and second outdoor air unit 70") are provided on the "exterior side" (outside the building).

The configuration as the indirect outdoor air cooler is realized herein by the first indoor air unit 60' and the first outdoor air unit 70'. The configuration as the general air conditioner (refrigerator) is realized herein by the second indoor air unit 60" and the second outdoor air unit 70".

The configuration as the indirect outdoor air cooler will be explained first.

In the example illustrated in the figure, the liquid-gas heat exchanger 61b and the fan 61c are provided inside the first indoor air unit 60', and the liquid-gas heat exchanger 71b and the fan 71c are provided inside the first outdoor air unit 70'. The piping 51 is connected to the liquid-gas heat exchanger 61b and the liquid-gas heat exchanger 71b, and the circulating pump 53 is provided at any position on the piping 51. The operation in such configuration has already been explained for FIG. 1, FIG. 2 and so forth, and will not be explained again herein.

The configuration as the general air conditioner (refrigerator) is explained next.

The evaporator 61a and the fan 61c are provided inside the second indoor air unit 60". The condenser 71a and the fan 71c are provided inside the second outdoor air unit 70". The expansion valve 54 and the compressor 55 are provided at any position. The refrigerant piping 52 is connected to the evaporator 61a, the condenser 71a, the expansion valve 54 and the compressor 55, such that a refrigerant circulates through the foregoing. The operation in such configurations has already been explained for FIG. 1, FIG. 2 and so forth, and will not be explained again herein.

In the case of the present configuration, the fan 61c and the fan 71c must be provided as a set of two respectively, as described above.

In the configurations of FIG. 12 and so forth, warm air RA described above flows into the first indoor air unit 60' through the indoor air inlet 62, and basically the temperature of the warm air RA is lowered through cooling by virtue of the configuration as the indirect outdoor air cooler, and air is discharged then through the indoor air outlet 63. The warm air having had the temperature thereof lowered will be notated as RA'.

The warm air RA' having had the temperature thereof lowered as described above flows into the second indoor air unit 60" through the indoor air inlet 62, and is cooled, by virtue of the configuration as the general air conditioner (refrigerator), to yield cold air SA that is discharged through the indoor air outlet 63.

Although not shown in the figures, a duct may be required in some instances in order to lead the warm air RA', having had the temperature thereof lowered and that is discharged through the indoor air outlet 63 of the first indoor air unit 60', towards the indoor air inlet 62 of the second indoor air unit 60".

The installation position of the control device 110 may be any position, in the instances of FIG. 12 and FIG. 13. Basically, the control device 110 controls all the structures illustrated in FIG. 12 and FIG. 13.

In FIG. 13, the circulating pump 53, the expansion valve 54, and the compressor 55 are all provided outside the units, but the example is not limited to this, and as in the case of FIG. 11, the circulating pump 53, the expansion valve 54 and the compressor 55 may be provided inside the units.

In the above explanation, the control device 110 was explained as one single device, but may be installed in the form of a plurality of devices that is controlled cooperatively. In all cases, however, control commands for the indirect outdoor air cooler and the general air conditioner are controlled uniquely, regardless of the number of control devices 110.

As described above, conventional instances involved the problem of lowered efficiency in that the cooling capacity of indirect outdoor air cooling was wasted, and the performance of an indirect outdoor air cooler of high efficiency (COP) could not be fully brought out, as a result of switching to the individual operation of the refrigerator in a case where the cooling capacity of the indirect outdoor air cooler was insufficient. By contrast, the present method allows solving such a problem, and allows the performance of an indirect outdoor air cooling having high efficiency (COP) to be fully brought out, and enhance thus cooling efficiency.

Figure 14:
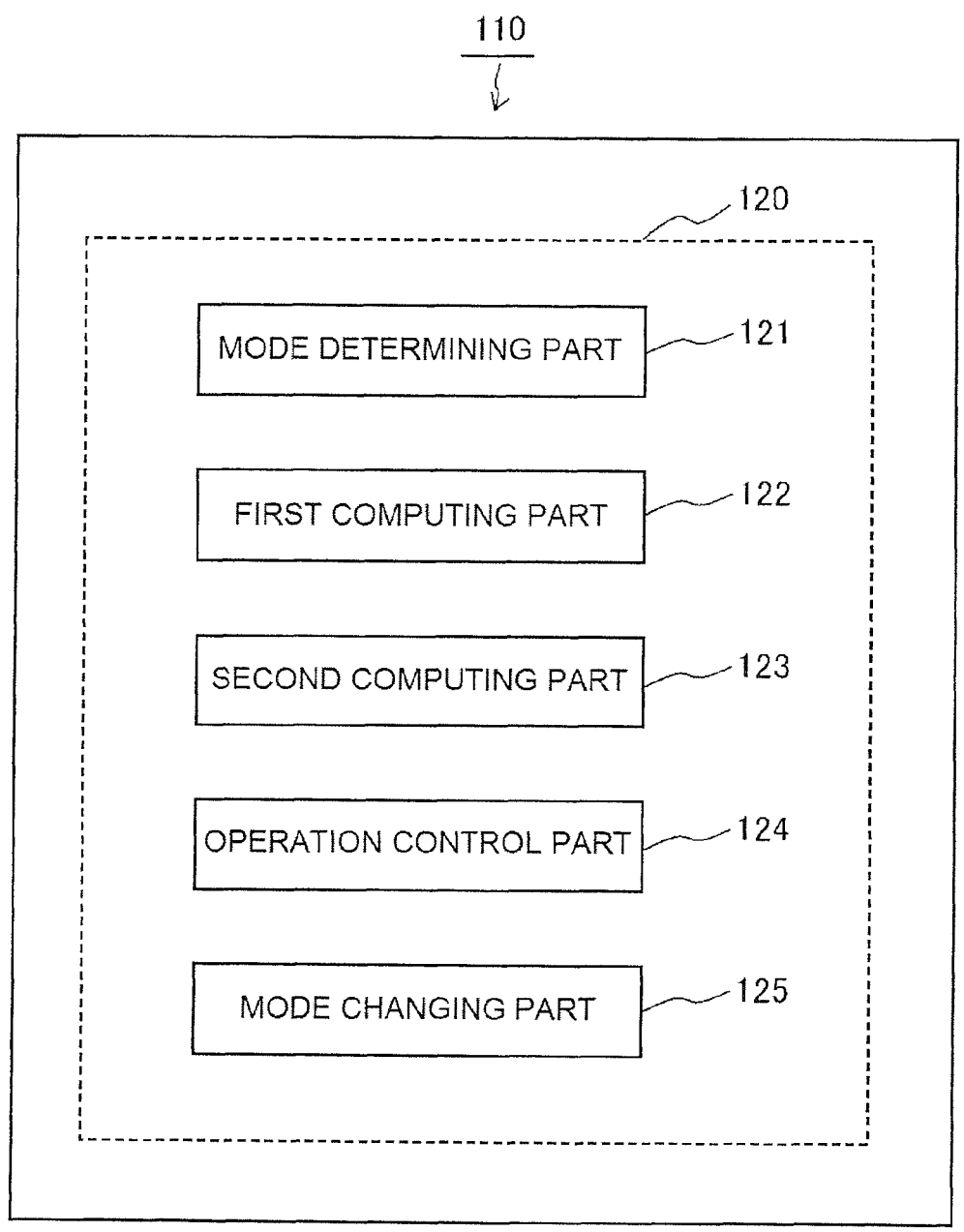
FIG. 14 is a functional block diagram of a control device.

FIG. 14 is a functional block diagram of the control device 110.

The diagram may be regarded as a functional block diagram of the computing part 112. Although not particularly depicted in the figures, the computing part 112 for instance has, as described above, a computing processor such as a CPU/MPU, and a storage part such as a memory. The storage part not shown has stored therein beforehand a predefined application program. Through reading and execution of the application program, the computing processor not shown realizes the functions and processes of the process in the flowchart of FIG. 6 and of the various functional parts illustrated in FIG. 14.

The integrated air conditioning system 50 described above will be explained again prior to an explanation of FIG. 14.

The integrated air conditioning system 50 described above can be explained for instance as follows.

Specifically, the integrated air conditioning system 50 has an indirect outdoor air cooler, an air conditioner, a common fan, and the control device 110.

The indirect outdoor air cooler has the first heat exchanger 61*b* that allows passage of indoor air as warm air, the second heat exchanger 71*b* that allows passage of outdoor air, and the piping 51 and circulating pump 53 that cause any fluid to circulate through the first heat exchanger 61*b* and the second heat exchanger 71*b*.

The air conditioner, which operates according to a compression refrigeration cycle and that turns the indoor air into cold air, has, for instance, at least the evaporator 61*a* through which there passes indoor air having passed through the first heat exchanger 61*b*, the compressor 55, and the condenser 71*a*.

The common fan, which is a fan used in the indirect outdoor air cooler and the air conditioner, causes outdoor air to pass through the second heat exchanger 71*b* and the condenser 71*a*.

Schematically, the control device 110 sets, to a current operation mode, any one mode from among a first mode (corresponding to mode A) of individual operation of the indirect outdoor air cooler, a second mode (corresponding to mode D) of individual operation of the air conditioner, and a third mode (corresponding to mode B and mode C) of combined operation of the air conditioner and the indirect outdoor air cooler. The control device 110 further has a process functional part 120 that controls the operation of the air conditioner and/or the indirect outdoor air cooler in the current operation mode.

Further, mode B and mode C are identical to each other in terms of performing a combined operation of the air conditioner and the indirect outdoor air cooler, and hence are treated collectively as the third mode. Such being the case, mode B may be regarded as a restricted mode in which the air conditioner operates at minimum capacity. Meanwhile, mode C may be regarded as an unrestricted mode in which such a restriction of minimum capacity operation does not apply.

The control device 110 (process functional part 120) need not necessarily have all the various functional parts illustrated in the figure.

The control device 110 (process functional part 120) has a mode determining part 121 that determines, at any time, the current operation mode, on the basis of the temperature Tsa of the cold air, the temperature Tra of the warm air, and the temperature Toa of the outdoor air.

The control device 110 (process functional part 120) has a first computing part 122 that calculates the maximum cooling capacity Q(Qi) of the indirect outdoor air cooler on the basis of the difference between the warm air temperature Tra and the outdoor air temperature Toa (temperature of the outdoor air OA that flows into the outdoor air unit 70). The mode determining part 121 determines the current operation mode using the maximum cooling capacity Qi.

The control device 110 (process functional part 120) has a second computing part 123 that calculates the required cooling capacity Qreq on the basis of the difference between the warm air temperature Tra and the cold air temperature Tsa. The mode determining part 121 determines the current operation mode using the maximum cooling capacity Qi, or using the maximum cooling capacity Qi and the required cooling capacity Qreq. For instance, the current operation mode is determined in accordance with the various determination methods explained with reference to FIG. 4.

In a case where, for instance, the current operation mode is in the first mode, the mode determining part 121 switches the current operation mode to the third mode (restricted mode thereof) once the maximum cooling capacity Qi of the indirect outdoor air cooler becomes smaller than the required cooling capacity Qreq (for instance, smaller than Q1 above). On the other hand, if the current operation mode is in the third mode (restricted mode thereof), the mode determining part 121 switches the current operation mode to the first mode once the maximum cooling capacity Qi of the indirect outdoor air cooler becomes equal to or higher than the required cooling capacity Qreq (for instance, equal to or higher than Q4 above).

In a case where, for instance, the current operation mode is in the restricted mode, the mode determining part 121 switches the current operation mode to the unrestricted mode once the maximum cooling capacity Qi of the indirect outdoor air cooler becomes smaller than the difference (for instance, Q2 above) between the required cooling capacity Qreq and the cooling capacity of the air conditioner at the time of the restricted mode (minimum capacity Qr). On the other hand, if the current operation mode is in the unrestricted mode, the mode determining part 121 switches the current operation mode to the restricted mode once the maximum cooling capacity Qi becomes larger than the above difference (for instance, Q2 above).

In a case where, for instance, the current operation mode is in the unrestricted mode, the mode determining part 121 switches the current operation mode to the second mode once the maximum cooling capacity Qi of the indirect outdoor air cooler becomes smaller than a predefined threshold value (for instance, takes on value smaller than zero, namely a negative value). On the other hand, if the current operation mode is in the second mode, the mode determining part 121 switches the current operation mode to the unrestricted mode once the maximum cooling capacity Qi of the indirect outdoor air cooler exceeds the predefined threshold value (for instance, exceeds 0, i.e. takes on a positive value).

The indirect outdoor air cooler is operating at the maximum cooling capacity Qi upon switching from the first mode to the restricted mode, or upon switching from the restricted mode to the unrestricted mode, or upon switching from the unrestricted mode the second mode. That is, the above mode changes are performed, regardless of the mode (except the second mode), if the required cooling capacity Qreq cannot be covered, even if the cooling capacity of the indirect outdoor air cooler in that state is used to the maximum.

The control device 110 has an operation control part 124 that controls the rotational speed of the pump, or the rotational speed of the fans, or the rotational speed of the compressor, in such a manner that the cold air temperature Tsa lies within a predefined range based on a set value, regardless of whether the current operation mode is in the first mode, the second mode, or the third mode.

The control device 110 may have a mode changing part 125 instead of the mode determining part 121, the first computing part 122 and the second computing part 123. Basically, the mode changing part 125 performs mode switching, as needed, by determining the current mode in the same way as the mode determining part 121, although the processing content is herein different.

Specifically, the mode changing part 125 performs a mode change, for instance, in a case where the cold air temperature Tsa cannot be maintained within a predefined range based on a set value through control of the rotational speed of the pump, or the rotational speed of the fans, or the rotational speed of the compressor, under the predefined condition of the current operation mode, regardless of whether the current operation mode is in the first mode, the second mode, the restricted mode or the unrestricted mode.

For instance, the predefined condition may involve the rotational speed of the compressor being set to minimum, in the case of the restricted mode, or the rotational speed of the compressor being set to '0' (i.e. compressor stopped), in the case of the first mode.

The predefined range comprises an upper limit value (for instance Tsamax above) and a limit lower limit value (for instance Tsamin above).

The mode changing part 125 switches the mode towards non-energy saving, regardless of the mode, if the cold air temperature Tsa exceeds the upper limit value. Specifically, the mode is changed to the restricted mode if the current operation mode is in the first mode. The mode is changed to the unrestricted mode if the current operation mode is the restricted mode. The mode is changed to the second mode if the current operation mode is in the unrestricted mode.

The mode changing part 125 switches the mode towards energy saving, regardless of the mode, if the cold air temperature Tsa is below the lower limit value. Specifically, the mode is changed to the first mode if the current operation mode is in the restricted mode. The mode is changed to the restricted mode if the current operation mode is in the unrestricted mode. The mode is changed to the unrestricted mode if the current operation mode is in the second mode.

Other embodiments are explained next with reference to FIG. 15, FIG. 16, and FIG. 17.

In the embodiment explained above, the exterior fan rotational speed (as described above, rotational speed of the fan 71c, which may be regarded also as the air volume) was switched from maximum to minimum upon transition from mode A to mode B, for instance as illustrated in FIG. 5(a). That is, the outdoor air volume by the fan was modified from maximum to minimum. In the transition from mode B to mode A, the exterior fan rotational speed (air volume) was switched from minimum to maximum. That is, the outdoor air volume by the fan was modified from minimum to maximum. In such switching of maximum to/from minimum, control becomes unstable, and the required cooling capacity is not necessarily achieved immediately after the transition.

For instance, the transition from mode A to mode B is executed, whereupon the general air conditioner is started up, as described above (operating at minimum capacity), in a case where the required cooling capacity Qreq can no longer be covered with the individual operation of the indirect outdoor air cooler. It is clear that cooling capacity becomes excessive as a result if the exterior fan rotational speed (air volume) remains at maximum, but the cooling capacity may become insufficient if the exterior fan rotational speed (air volume) is set to minimum. For the transition from mode A to mode B, therefore, the exterior fan rotational speed (air volume) is preferably set to an appropriate value (in such a manner that the required cooling capacity Qreq is obtained overall). The same is true for the transition from mode B to mode A.

In the above other embodiment, an appropriate exterior fan rotational speed (air volume) is set for the transition from mode A to mode B, or for the transition from mode B to mode A, as described above, in such a manner that a required cooling capacity is obtained as a result, and changes are carried out smoothly, to improve control stability.

Figure 15:
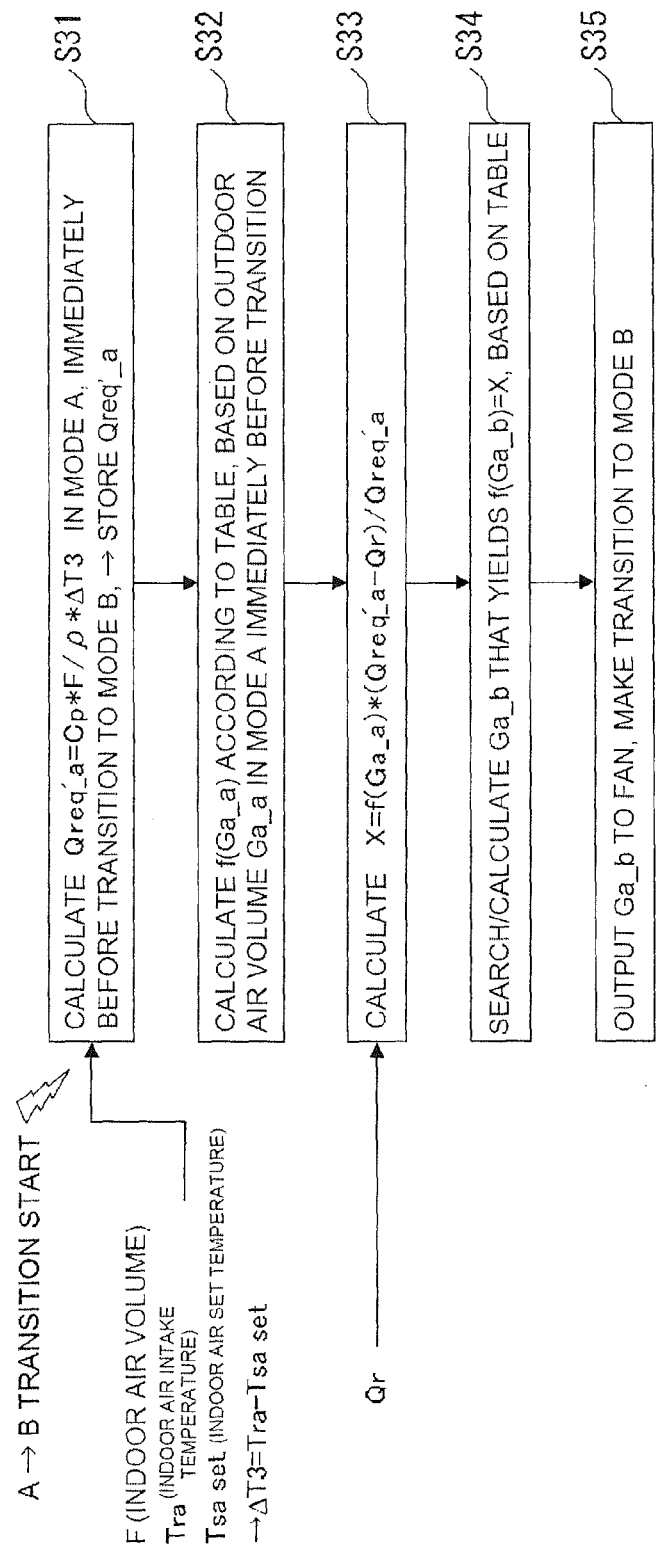
FIG. 15 is a process flowchart diagram (I) of another embodiment.
Figure 16:
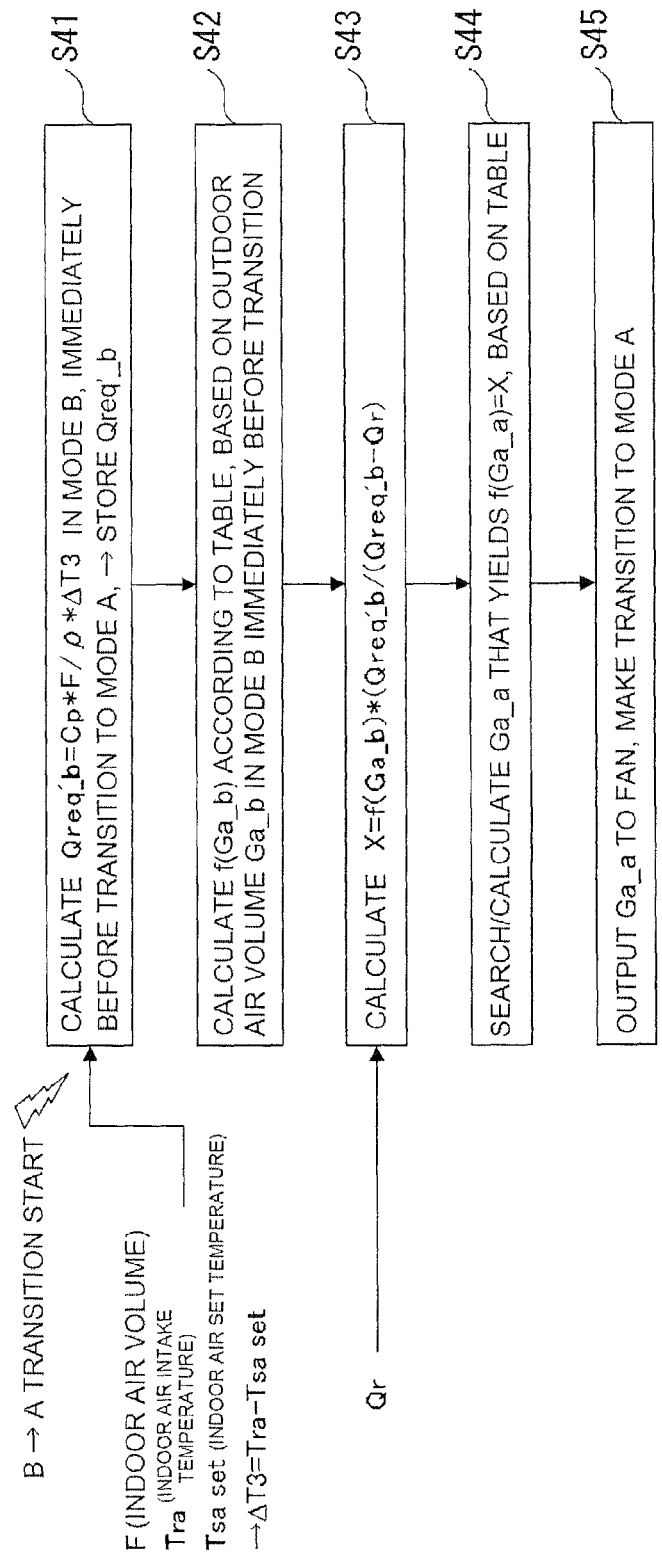
FIG. 16 is a process flowchart diagram (II) of another embodiment.

FIG. 15 is a process flowchart diagram (I) of another embodiment.

The process in FIG. 15 and the process in FIG. 16 described below are executed, for instance, by the computing part 112.

FIG. 15 can be regarded as a determination process flowchart diagram of the exterior fan rotational speed (air volume) in the transition from mode A to mode B in the other embodiment. According to this process, transition from mode A to mode B is performed after determination of the exterior fan rotational speed (air volume). Specifically, control involves modifying the exterior fan rotational speed to "determined rotational speed", and starting the general air conditioner (operation start at minimum capacity).

In the transition from mode A to mode B in the embodiment described above, the exterior fan rotational speed was fixedly prescribed to a minimum value; in the "other embodiment", however, the exterior fan rotational speed is determined according to the process of FIG. 15. Except for this feature, the "other embodiment" can be regarded as substantially identical to the one embodiment described above.

Firstly, a required cooling capacity Qreq' at an arbitrary point in time is obtained from Expression (1) below.

$$Q\text{req}'=Cp*F/\rho*\Delta T3 \quad \text{Expression (1)}$$

(where $Cp$: specific heat at constant pressure, $\rho$: air density, $F$: indoor air volume, $\Delta T3 = Tra - Tsaset$ (temperature difference between the warm air temperature and the set temperature))

The symbol denotes multiplication, and the symbol/denotes division.

It is found that the calculation expression of the required cooling capacity Qreq' involves using the above $\Delta T3$ instead of $\Delta T2$ in the calculation expression of the required cooling capacity Qreq. The symbol $\Delta$ denotes delta (increment).

Accordingly, in a case where, in mode A, transition to mode B is determined to be performed, firstly, a required cooling capacity Qreq'_a at that time (in mode A, immediately before transition to mode B) is calculated on the basis of Expression (1)' below using the values of F, Tra and Tsaset at that time, and the calculated result is stored temporarily (step S31).

$$Qreq'\_a = Cp*F/\rho*\Delta T3 \qquad \text{Expression (1)'}$$

Herein, a cooling capacity Qp of the indirect outdoor air cooler is given by Expression (2) below, as the amount of heat that the outdoor air drains from brine (refrigerant, coolant or the like).

$$Qp = f(Ga)*(Tb-Toa) \qquad \text{Expression (2)}$$

(where Ga: outdoor air volume (kg/min), Tb: brine temperature, Toa: outdoor air temperature, with Ga worked out from an existing process, on the basis of the exterior fan rotational speed)

Although not shown in the figures, a thermometer that measures the temperature of the liquid in the piping 51 (in particular, temperature immediately before inflow into the liquid-gas heat exchanger 71b), is further provided in addition to the various thermometers illustrated in for instance FIG. 3, such that the brine temperature Tb is measured by that additional thermometer.

Herein, f(Ga) is a function determined depending on the air volume Ga, and is thus determined by the characteristics of the heat exchanger. Accordingly, the relationship between f(Ga) and the air volume Ga is worked out beforehand, for instance experimentally, and is stored in the form, for instance, of a graph (table) of f(Ga) such as the one illustrated in FIG. 17.

The process of step S31 is accordingly followed by working out of the value of a function value f(Ga_a) corresponding to the current air volume (set to Ga_a), for instance by referring to the graph (table) of f(Ga) (step S32).

Herein, a cooling capacity Qp_a of the indirect outdoor air cooler, in a case where the outdoor air volume is Ga_a above, is given by Expression (2)' below using Expression (2) above.

$$Qp\_a = f(Ga\_a)*(Tb-Toa) \qquad \text{Expression (2)'}$$

Herein, mode A involves the operation of the indirect outdoor air cooler alone, and hence the cooling capacity of indirect outdoor air conditioning should be equal to the required cooling capacity (control performed to make it so). Accordingly, Expression (3) holds in relation to Expression (1)' and Expression (2)'.

$$Qp\_a = Qreq'\_a \qquad \text{Expression (3)}$$

A cooling capacity Qp_b of the indirect outdoor air air conditioner immediately after transition to mode B is preferably $$Qp\_b = Qreq'\_a - Qr$$

(as explained above, Qr is the minimum cooling capacity of the general air conditioner).

It is deemed that Expression (4) below holds, where Ga_b denotes an appropriate air volume (set value to be prescribed) of the outdoor air fan immediately after transition to mode B, given that Tb and Toa exhibit ostensibly no change, since the elapsed time is short.

$$f(Ga\_b)*(Tb-Toa) = Qreq'\_a - Qr \qquad \text{Expression (4)}$$

Expression (5) below is obtained from Expression (2)' and Expression (4).

$$X = f(Ga\_a)*(Qreq'\_a - Qr)/Qreq'\_a \qquad \text{Expression (5)}$$

(where X is preferably the value of f(Ga_b))

The function value X (=preferred f(Ga_b)) corresponding to the preferred air volume (set to Ga_b) immediately after transition to mode B is worked out according to Expression (5) above (step S33), on the basis of the process result of steps S31 and S32 above.

The air volume Ga_b that yields f(Ga_b)=X is worked out with reference to the f(Ga) graph (table) above (step S34). The transition process to mode B is performed thereupon (step S35). The transition process itself may be substantially identical to that of the one embodiment explained above, but herein, naturally, the exterior fan rotational speed is set to a rotational speed in accordance with the air volume Ga_b worked out in step S34 (i.e. can be calculated according to an existing process).

The air volume Ga_b or the exterior fan rotational speed corresponding thereto may be for instance forwarded to a set air volume blowing section, not shown. The set air volume blowing section may be one inverter fan, or may be implemented by combining an inverter fan with a plurality of controls of a plurality of constant-air volume fans.

The process at the time of transition from mode B to mode A will be explained next with reference to FIG. 16.

In a case where, in mode B, transition to mode A is determined to be performed, firstly, a required cooling capacity Qreq'_b at that time (in mode B, immediately before transition to mode A) is calculated on the basis of Expression (1)" below using the values of Tra and Tsaset at that time, and the calculated result is stored temporarily (step S41).

$$Qreq'\_b = Cp*F/\rho*\Delta T3 \qquad \text{Expression (1)"}$$

Next, the value of the function value f(Ga_b) corresponding to the current air volume (set to Ga_b) is worked out for instance by referring to the f(Ga) graph (table) (step S42).

A function value X' corresponding to the preferred air volume (set to Ga_a) immediately after transition to mode A is worked out according to Expression (8) below, on the basis of the process result of steps S41 and S42 above (step S43).

Herein, Expression (6) below holds, with the air volume at the current point in time (in mode B) set to Ga_b.

$$f(Ga\_b)*(Tb-Toa) = Qreq'b - Qr \qquad \text{Expression (6)}$$

It is deemed that Expression (7) below holds, where Ga_a denotes an appropriate air volume of the outdoor air fan (set value to be prescribed) immediately after transition to mode A, given that Tb and Toa exhibit ostensibly no change, since the elapsed time is short.

$$f(Ga\_a)*(Tb-Toa) = Qreg'\_b \qquad \text{Expression (7)}$$

Expression (8) below is obtained from Expression (6) and Expression (7).

$$X' = f(Ga\_b)*Qreq'\_b/(Qreq'\_b - Qr) \qquad \text{Expression (8)}$$

(where X' is a preferred f(Ga_a) value)

Expression (8) may be regarded as an expression having substantially the same meaning as Expression (5).

The air volume Ga_a that yields f(Ga_a)=X' is worked out with reference to the f(Ga) graph (table) above (step S44). The transition process to mode A is performed thereupon (step S45). The transition process itself may be substantially identical to that of the one embodiment explained above, but herein, naturally, the exterior fan rotational speed is set to a rotational speed in accordance with the air volume Ga_a worked out in step S44 (i.e. can be calculated according to an existing process).

For instance, in a hypothetical case of Qreg'_a=20 [kW], Qr=8 [kW] and Ga_a=60 [m³/h] for transition mode A→mode B, then f(Ga_a)=f(60)=79.09703 according to the table in FIG. 17, and hence the following values are calculated on the basis of Expression (5) below.

$$f(Ga\_b) = f(Ga\_a) * (Qreq'\_a - Qr)/Qreq'\_a$$
$$= 79.09703 * (20 - 8)/20$$
$$= 47.46$$

Figure 17:
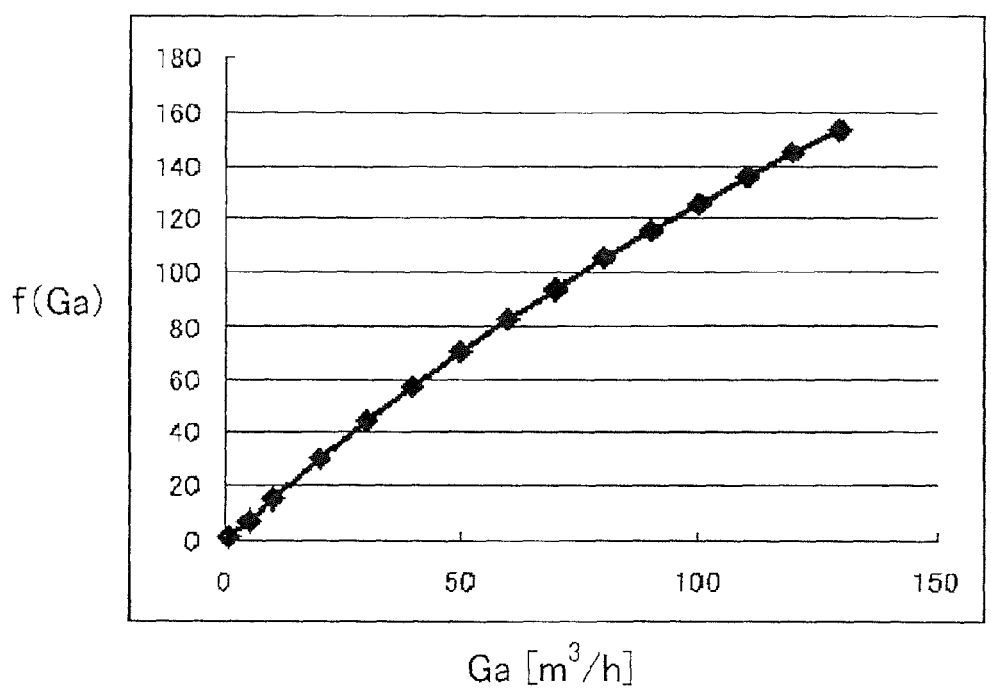
FIG. 17 is an f(Ga) graph.

The Ga_b that satisfies the above is obtained as 29.27467 [m³/h] according to the table in FIG. 17.

The above explanation is illustrative in character, and is not limited to the examples above. For instance, the required cooling capacity Qreq may be used instead of the required cooling capacity Qreq'.

In the "other embodiment", as described above, the appropriate outdoor air fan air volume (exterior fan rotational speed) can be calculated and set during the transition from mode A to mode B, or during the transition from mode B to mode A. As used herein, the term "appropriate" denotes, for instance, prescribing the overall cooling capacity immediately after the transition to be substantially identical to the required cooling capacity Qreq'. The stability of the blow-out temperature (refrigerating capacity) at the time of switching of mode A to/from mode B is enhanced as a result (it becomes possible to suppresses instability of the "blow-out temperature" arising from discontinuous changes in refrigerating capacity at the time of mode switching). This allows preventing likewise fluctuations in the indoor air temperature (in particular, the temperature of the cold air). The occurrence of large changes, such as a change of the outdoor air fan air volume (exterior fan rotational speed) from maximum to minimum (or from minimum to maximum), can be expected to become less likely as a result (at least, large changes do not occur always, as in the one embodiment above).

The integrated air conditioning system of the present invention, as well as the control device and so forth of the integrated air conditioning system, involve configurations that enable combined operation of two cycles, namely an indirect outdoor air cooling cycle and a compression-type cooling cycle. Cooling efficiency can be enhanced by switching to either the individual operation mode or the combined operation mode, from among these two cycles, depending on the situation, and by substantially optimizing the control method in each mode.

What is claimed is:

1. An integrated air conditioning system, comprising:
   an indirect outdoor air cooler having a first heat exchanger for passing through indoor air as warm air, a second heat exchanger for passing through outdoor air, and piping and a pump for circulating a fluid through the first heat exchanger and the second heat exchanger;
   an air conditioner operated on a basis of a compression refrigeration cycle and having an evaporator, a compressor, and a condenser, for passing the indoor air, after having passed through the first heat exchanger, to convert to cold air;
   a common fan for passing the outdoor air through the second heat exchanger and the condenser; and
   a control device,
   wherein the control device sets an operation mode from among a first mode for performing an individual operation of the indirect outdoor air cooler, a second mode for performing an individual operation of the air conditioner, or a third mode for performing a combined operation of the air conditioner and the indirect outdoor air cooler, and executes operation control of the air conditioner and/or the indirect outdoor air cooler according to the operation mode,
   the control device has a mode determining device to determine the operation mode based on a temperature of the cold air, a temperature of the warm air, and a temperature of the outdoor air,
   the control device has a first computing device for calculating a maximum cooling capacity of the indirect outdoor air cooler based on a difference between the temperature of the warm air and the temperature of the outdoor air, and
   the mode determining device determines the operation mode using the maximum cooling capacity.

2. The integrated air conditioning system according to claim 1, wherein the control device further has a second computing device for calculating a required cooling capacity based on a difference between the temperature of the warm air and the temperature of the cold air; and
   the mode determining device determines the operation mode using either the maximum cooling capacity or the maximum cooling capacity and the required cooling capacity.

3. The integrated air conditioning system according to claim 2, wherein the third mode comprises a restricted mode to operate the air conditioner at a minimum capacity, and an unrestricted mode which is a mode lacking the restriction of minimum capacity operation.

4. The integrated air conditioning system according to claim 3, wherein when the operation mode is in the first mode, the mode determining device switches from the first mode to the restricted mode of the third mode when the maximum cooling capacity of the indirect outdoor air cooler becomes less than the required cooling capacity.

5. The integrated air conditioning system according to claim 3, wherein when the operation mode is in the restricted mode, the mode determining device switches from the restricted mode to the unrestricted mode of the third mode when the maximum cooling capacity of the indirect outdoor air cooler becomes less than the difference between the required cooling capacity and a cooling capacity of the air conditioner at a time of the restricted mode.

6. The integrated air conditioning system according to claim 3, wherein when the operation mode is in the unrestricted mode, the mode determining device switches from the unrestricted mode to the second mode when the maximum cooling capacity of the indirect outdoor air cooler exhibits a negative value.

7. The integrated air conditioning system according to claim 4, wherein the indirect outdoor air cooler operates at the maximum cooling capacity upon switching from the first mode to the restricted mode, upon switching from the restricted mode to the unrestricted mode, or upon switching from the unrestricted mode to the second mode.

8. The integrated air conditioning system according to claim 5, wherein the indirect outdoor air cooler operates at the maximum cooling capacity upon switching from the first mode to the restricted mode, or upon switching from the restricted mode to the unrestricted mode, or upon switching from the unrestricted mode to the second mode.

9. An integrated air conditioning system, comprising:
   an indirect outdoor air cooler having a first heat exchanger for passing through indoor air as warm air, a second heat exchanger for passing through outdoor air, and piping and a pump for circulating a fluid through the first heat exchanger and the second heat exchanger;

an air conditioner operated on a basis of a compression refrigeration cycle and having an evaporator, a compressor, and a condenser, for passing the indoor air, after having passed through the first heat exchanger, to convert to cold air;

a common fan for passing the outdoor air through the second heat exchanger and the condenser; and a control device, wherein the control device sets an operation mode from among a first mode for performing an individual operation of the indirect outdoor air cooler, a second mode for performing an individual operation of the air conditioner, or a third mode for performing a combined operation of the air conditioner and the indirect outdoor air cooler, and executes operation control of the air conditioner and/or the indirect outdoor air cooler according to the operation mode, the third mode comprises a restricted mode to operate the air conditioner at a minimum capacity, and an unrestricted mode which is a mode lacking a restriction of the minimum capacity operation, and the control device has a mode change device for performing a mode change when a temperature of the cold air cannot be maintained within a predetermined range based on a set value by controlling a rotation number of the pump, a rotation number of the fan, or a rotation number of the compressor under a current operation mode.

10. The integrated air conditioning system according to claim 9, wherein the predetermined range comprises an upper limit value and a lower limit value; and when the cold air temperature exceeds the upper limit value, the mode change device performs the mode change to the restricted mode in a case where the current operation mode is in the first mode, performs the mode change to the unrestricted mode in a case where the current operation mode is in the restricted mode, and performs the mode change to the second mode in a case where the current operation mode is in the unrestricted mode.

11. The integrated air conditioning system according to claim 9, wherein the predetermined range comprises an upper limit value and a lower limit value; and when the cold air temperature is below the lower limit value, the mode change device performs the mode change to the first mode in a case where the current operation mode is in the restricted mode, performs the mode change to the restricted mode in a case where the current operation mode is in the unrestricted mode, and performs the mode change to the unrestricted mode when the current operation mode is in the second mode.

12. The integrated air conditioning system according to claim 1, wherein when switching from the first mode to the third mode, the control device sets an air volume of the fan immediately after mode switching to a minimum.

13. The integrated air conditioning system according to claim 1, wherein when switching from the third mode to the first mode, the control device sets an air volume of the fan immediately after mode switching to a maximum.

14. An integrated air conditioning system, comprising:
an indirect outdoor air cooler having a first heat exchanger for passing through indoor air as warm air, a second heat exchanger for passing through outdoor air, and piping and a pump for circulating a fluid through the first heat exchanger and the second heat exchanger;

an air conditioner operated on a basis of a compression refrigeration cycle and having an evaporator, a compressor, and a condenser, for passing the indoor air, after having passed through the first heat exchanger, to convert to cold air;

a common fan for passing the outdoor air through the second heat exchanger and the condenser; and a control device, wherein the control device sets an operation mode from among a first mode for performing an individual operation of the indirect outdoor air cooler, a second mode for performing an individual operation of the air conditioner, or a third mode for performing a combined operation of the air conditioner and the indirect outdoor air cooler, and executes operation control of the air conditioner and/or the indirect outdoor air cooler according to the operation mode, when switching from the first mode to the third mode or when switching from the third mode to the first mode, the control device determines an air volume of the fan immediately after mode switching based on a required cooling capacity and a cooling capacity of the indirect outdoor air cooler at the time when switching the mode, a function f(Ga) based on an air volume Ga of the fan immediately before the mode switching, the required cooling capacity Qreq', and a minimum cooling capacity Qr of the air conditioner are used to obtain an X value according to the expression below to determine the air volume of the fan immediately after the mode switching:

$$X = f(Ga)*(Q\text{req}' - Qr/Q\text{reg}'), \text{ and}$$

the required cooling capacity Qreq' is calculated in accordance with the expression below:

Required cooling capacity $Q\text{req}' = Cp*F/\rho*\Delta T3$ wherein Cp: specific heat of air at constant pressure, $\rho$: air density, F: indoor air volume, and $\Delta T3 = Tra - Tsaset$ (temperature difference between warm air temperature and a set temperature).

15. An integrated air conditioning system, comprising:
an indoor air unit for passing through indoor air;
an outdoor air unit for passing through outdoor air; and
a control device, wherein the indoor air unit has a first heat exchanger, an evaporator, and a first fan for passing the indoor air through the first heat exchanger and the evaporator, the outdoor air unit has a second heat exchanger, a condenser, and a second fan for passing the outdoor air through the second heat exchanger and the condenser, an air conditioner is constructed on a basis of a compression refrigeration cycle by providing a refrigerant piping connected to the evaporator, the condenser, an expansion valve provided in either the outdoor air unit or the indoor air unit, and a compressor provided in either the outdoor air unit or the indoor air unit, and circulating a refrigerant through the evaporator, the condenser, the expansion valve, and the compressor, via the refrigerant piping, and an indirect outdoor air cooler is constructed by providing a piping connected to the first heat exchanger and the second heat exchanger, circulating any fluid through the first heat exchanger and the second heat exchanger via the piping, cooling the fluid by the outdoor air by heat exchanging the fluid with the outside air in the second heat exchanger, and heat exchanging of the cooled fluid and the indoor air in the first heat exchanger, to thereby cooling the indoor air with the fluid, the control device sets an operation mode from among a first mode for performing an individual operation of the indirect outdoor air cooler, a second mode for performing an individual operation of the air conditioner, or a third mode for performing a combined operation of the air conditioner and the indirect outdoor air cooler, and executes operation control of the air conditioner and/or the indirect outdoor air cooler according to the operation mode, the control device has a mode determining device to determine the operation mode based on a temperature of the cold air, a temperature of the warm air, and a temperature of the outdoor air, the control device has a first computing device for calculating a maximum cooling capacity of the indirect outdoor air cooler based on a difference between the temperature of the warm air and the temperature of the outdoor air, and the mode determining device determines the operation mode using the maximum cooling capacity.

16. The integrated air conditioning system according to claim 15, wherein in the indoor air unit, a first stack is configured through integral stacking of the first heat exchanger, the evaporator, and the first fan.

17. The integrated air conditioning system according to claim 15, wherein in the outdoor air unit, a second stack is configured through integral stacking of the second heat exchanger, the condenser, and the second fan.

18. The integrated air conditioning system according to claim 15, wherein in the indoor air unit, the first heat exchanger is provided on an upstream side of flow of the indoor air as formed by the first fan, and the evaporator is provided on a downstream side of the flow of the indoor air.

19. The integrated air conditioning system according to claim 15, wherein in the outdoor air unit, the second heat exchanger is provided on an upstream side of flow of the outdoor air as formed by the second fan, and the condenser is provided on a downstream side of the flow of the outdoor air.

20. A control device of an integrated air conditioning system, for controlling an indirect outdoor air cooler including:

a first heat exchanger for passing through indoor air as warm air, a second heat exchanger for passing through outdoor air, and piping and a pump for circulating a fluid through the first heat exchanger and the second heat exchanger;

an air conditioner operated on a basis of a compression refrigeration cycle and having an evaporator for passing through the indoor air after having passed through the first heat exchanger, to convert to cold air, a compressor, and a condenser; and a common fan for passing the outdoor air through the second heat exchanger and the condenser, the control device comprising:

a control apparatus for setting an operation mode from among a first mode for performing an individual operation of the indirect outdoor air cooler, a second mode for performing an individual operation of the air conditioner, or a third mode for performing a combined operation of the air conditioner and the indirect outdoor air cooler, and for executing operation control of the air conditioner and/or the indirect outdoor air cooler according to the operation mode;

a mode determining device to determine the operation mode based on a temperature of the cold air, a temperature of the warm air, and a temperature of the outdoor air; and a first computing device for calculating a maximum cooling capacity of the indirect outdoor air cooler based on a difference between the temperature of the warm air and the temperature of the outdoor air, wherein the mode determining device determines the operation mode using the maximum cooling capacity.

* * * * *